United States Patent
Tsuyama et al.

(10) Patent No.: US 12,152,139 B2
(45) Date of Patent: Nov. 26, 2024

(54) COMPOSITION, FILM, OPTICAL FILTER, LAMINATE, SOLID-STATE IMAGING ELEMENT, IMAGE DISPLAY DEVICE, AND INFRARED SENSOR

(71) Applicant: FUJIFILM Corporation, Tokyo (JP)

(72) Inventors: Hiroaki Tsuyama, Shizuoka (JP);
Takuya Tsuruta, Shizuoka (JP);
Kyohei Arayama, Shizuoka (JP);
Tetsushi Miyata, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 960 days.

(21) Appl. No.: 17/105,302

(22) Filed: Nov. 25, 2020

(65) Prior Publication Data
US 2021/0079210 A1 Mar. 18, 2021

Related U.S. Application Data

(63) Continuation of application No. PCT/JP2019/027931, filed on Jul. 16, 2019.

(30) Foreign Application Priority Data

Aug. 15, 2018 (JP) ................................. 2018-152928

(51) Int. Cl.
| | | |
|---|---|---|
| C08L 57/12 | (2006.01) | |
| C08K 5/00 | (2006.01) | |
| C08K 5/17 | (2006.01) | |
| C08L 57/10 | (2006.01) | |
| G02B 5/22 | (2006.01) | |
| G02B 5/24 | (2006.01) | |

(52) U.S. Cl.
CPC ............ *C08L 57/12* (2013.01); *C08K 5/0041* (2013.01); *C08L 57/10* (2013.01); *G02B 5/223* (2013.01); *G02B 5/24* (2013.01); *C08K 5/17* (2013.01)

(58) Field of Classification Search
CPC ................................. C08K 5/0041; C08K 5/17
See application file for complete search history.

(56) References Cited

U.S. PATENT DOCUMENTS

| | | |
|---|---|---|
| 2014/0154482 A1 | 6/2014 | Jang |
| 2017/0114233 A1* | 4/2017 | Asami ................... C09D 11/322 |
| 2018/0356573 A1 | 12/2018 | Arayama et al. |
| 2019/0137671 A1 | 5/2019 | Kitajima |
| 2019/0285783 A1 | 9/2019 | Miyata |
| 2019/0300694 A1 | 10/2019 | Takahashi et al. |
| 2019/0309106 A1 | 10/2019 | Miyata et al. |
| 2020/0183277 A1 | 6/2020 | Tsuyama et al. |

FOREIGN PATENT DOCUMENTS

| | | |
|---|---|---|
| CN | 103827369 A | 5/2014 |
| JP | 2008303308 A * | 12/2008 |
| TW | 201741319 A | 12/2017 |
| TW | 201825603 A | 7/2018 |
| WO | WO 2017/038252 A1 | 3/2017 |
| WO | WO 2017/170339 A1 | 10/2017 |
| WO | WO 2018/047584 A1 | 3/2018 |
| WO | WO 2018/142799 A1 | 8/2018 |
| WO | WO 2018/142804 A1 | 8/2018 |
| WO | WO 2019/049626 A1 | 3/2019 |

OTHER PUBLICATIONS

"4,4'di-tert-butyldiphenylamine" from ChemSRC, << https://www.chemsrc.com/en/cas/4627-22-9_444899.html>> [retrieved on Mar. 14, 2024].*
Machine translation of WO 2017/038252 A1, published Mar. 9, 2017, retrieved from espacenet.com on Mar. 14, 2024.*
International Preliminary Report on Patentability and English translation of the Written Opinion of the International Searching Authority Forms PCT/IB/326, PCT/IB/373 and PCT/ISA/237 for corresponding International Application No. PCT/JP2019/027931, dated Feb. 25, 2021, with English translation.
International Search Report Form PCT/ISA/210 for corresponding International Application No. PCT/JP2019/027931, dated Oct. 8, 2019, with English translation.
Taiwanese Office Action and Search Report for corresponding Taiwanese Application No. 108126490, dated Jan. 31, 2023, with English translation.

* cited by examiner

*Primary Examiner* — Vickey Nerangis
(74) *Attorney, Agent, or Firm* — Birch, Stewart, Kolasch & Birch, LLP

(57) ABSTRACT

A composition includes a near infrared absorbing pigment, a compound represented by Formula (1), a primary to tertiary amine compound having a molecular weight of 500 or less and a boiling point of 300° C. or lower, a resin, and a solvent. The compound represented by Formula (1) has a solubility in propylene glycol methyl ether acetate at 25° C. of 0.1 g/L or higher. A content of the amine compound in a total solid content of the composition is 10-5000 mass ppm. In Formula (1), $P^1$ represents a colorant structure, $L^1$ represents a single bond or a linking group, $X^1$ represents an acid group, a basic group, a group having a salt structure, or a phthalimide methyl group, m is 1 or more, and n is 1 or more.

$$P^1-(L^1-(X^1)_n)_m \quad (1)$$

18 Claims, 1 Drawing Sheet

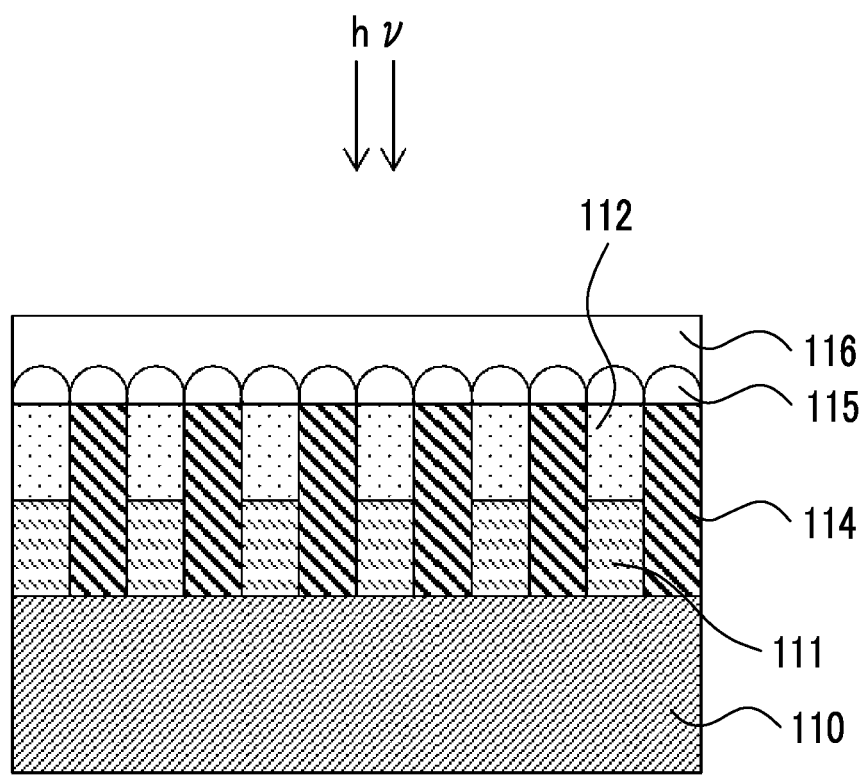

COMPOSITION, FILM, OPTICAL FILTER, LAMINATE, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2019/027931 filed on Jul. 16, 2019, which claims priority under 35 U.S.C § 119 (a) to Japanese Patent Application No. 2018-152928 filed on Aug. 15, 2018. Each of the above application(s) is hereby expressly incorporated by reference, in its entirety, into the present application.

BACKGROUND OF THE INVENTION

1. Field of the Invention

The present invention relates to a composition including a near infrared absorbing pigment, a film formed of the composition, an optical filter, a laminate, a solid-state imaging element, an image display device, and an infrared sensor.

2. Description of the Related Art

A charge coupled device (CCD) and a complementary metal-oxide semiconductor (CMOS), which are solid-state imaging elements for color images, have been used in video cameras, digital still cameras, mobile phones with camera functions, and the like. Since a silicon photodiode which is sensitive to near infrared rays is used in a light receiving section of these solid-state imaging elements, it is necessary to correct the luminosity factor, and a near infrared cut filter or the like is usually used. The near infrared cut filter may be produced using a composition including a near infrared absorbing pigment (see WO2017/038252A).

SUMMARY OF THE INVENTION

The composition including a near infrared absorbing pigment may be used immediately after production, or may be used after long-term storage after production.

As a study of the composition including a near infrared absorbing pigment by the present inventor, it has been found that, in a case where the composition is stored in a high temperature environment, a film formed from this composition is prone to defects.

Accordingly, an object of the present invention is to provide a composition capable of producing a film in which defects are suppressed. In addition, another object of the present invention is to provide a film in which defects are suppressed, and an optical filter, a laminate, a solid-state imaging element, an image display device, and an infrared sensor, which have the film.

As a result of intensive studies under the above-described circumstances, the present inventor has found that the above object can be achieved by using a composition described later, thereby leading to completion of the present invention. The present invention provides the following.

<1> A composition comprising:
a near infrared absorbing pigment;
a compound represented by Formula (1);
a primary to tertiary amine compound having a molecular weight of 500 or less and a boiling point of 300° C. or lower;
a resin; and
a solvent,
in which the compound represented by Formula (1) has a solubility in propylene glycol methyl ether acetate at 25° C. of 0.1 g/L or higher, and
a content of the amine compound in a total solid content of the composition is 10 to 5000 mass ppm,

  (1)

in Formula (1), $P^1$ represents a colorant structure, $L^1$ represents a single bond or a linking group, $X^1$ represents an acid group, a basic group, a group having a salt structure, or a phthalimide methyl group, m represents an integer of 1 or more, n represents an integer of 1 or more, in a case where m represents 2 or more, a plurality of $L^1$'s and a plurality of $X^1$'s may be different from each other, and in a case where n represents 2 or more, a plurality of $X^1$'s may be different from each other.

<2> The composition according to <1>,
in which the amine compound is an aliphatic amine compound.

<3> The composition according to <1> or <2>,
in which the amine compound is an alkylamine.

<4> The composition according to any one of <1> to <3>,
in which the near infrared absorbing pigment is at least one selected from the group consisting of a pyrrolopyrrole compound, a polymethine compound, a diimonium compound, a dithiolene compound, a phthalocyanine compound, a porphyrin compound, an azo compound, a triarylmethane compound, and a perylene compound.

<5> The composition according to any one of <1> to <4>,
in which a solubility of the near infrared absorbing pigment in propylene glycol methyl ether acetate at 25° C. is lower than the solubility of the compound represented by Formula (1) in propylene glycol methyl ether acetate at 25° C.

<6> The composition according to any one of <1> to <5>,
in which $P^1$ in Formula (1) is a colorant structure derived from a near infrared absorbing colorant.

<7> The composition according to any one of <1> to <6>,
in which $P^1$ in Formula (1) is a colorant structure selected from the group consisting of a pyrrolopyrrole colorant structure, a polymethine colorant structure, a diimonium colorant structure, a dithiolene colorant structure, a phthalocyanine colorant structure, a porphyrin colorant structure, an azo colorant structure, a triarylmethane colorant structure, a perylene colorant structure, and a quinacridone colorant structure.

<8> The composition according to any one of <1> to <7>,
in which $P^1$ in Formula (1) is a colorant structure having a skeleton common to the near infrared absorbing pigment.

<9> The composition according to any one of <1> to <8>,
in which $X^1$ in Formula (1) is an acid group, and the resin is a resin including a basic group.

<10> The composition according to any one of <1> to <9>,
in which $X^1$ in Formula (1) is at least one acid group selected from the group consisting of a carboxyl group, a sulfo group, a carboxylic acid amide group, a sulfonic acid amide group, and an imide acid group.

<11> A film formed of the composition according to any one of <1> to <10>.

<12> An optical filter comprising:
the film according to <11>.
<13> The optical filter according to <12>,
in which the optical filter is a near infrared cut filter or a near infrared transmitting filter.
<14> The optical filter according to <12> or <13>,
in which the optical filter has a pixel having the film according to <11>, and at least one pixel selected from the group consisting of a red pixel, a green pixel, a blue pixel, a magenta pixel, a yellow pixel, a cyan pixel, a black pixel, and an achromatic pixel.
<15> A laminate comprising:
the film according to <11>; and
a color filter including a chromatic coloring agent.
<16> A solid-state imaging element comprising:
the film according to <11>.
<17> An image display device comprising:
the film according to <11>.
<18> An infrared sensor comprising:
the film according to <11>.

According to the present invention, it is possible to provide a composition capable of producing a film in which defects are suppressed. In addition, it is possible to provide a film in which defects are suppressed, and an optical filter, a laminate, a solid-state imaging element, an image display device, and an infrared sensor, which have the film.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth) acryloyl" denotes either or both of acryloyl and methacryloyl.

In the present specification, a weight-average molecular weight and a number-average molecular weight are defined as values in terms of polystyrene measured by gel permeation chromatography (GPC).

In the present specification, in a chemical formula, Me represents a methyl group, Et represents an ethyl group, Bu represents a butyl group, and Ph represents a phenyl group.

In the present specification, near infrared light denotes light (electromagnetic wave) having a wavelength in a range of 700 to 2500 nm.

In the present specification, a total solid content denotes the total mass of all the components of the composition excluding a solvent.

In the present specification, the term "step" denotes not only an individual step but also a step which is not clearly distinguishable from another step as long as an effect expected from the step can be achieved.

<Composition>

A composition according to an embodiment of the present invention includes:
a near infrared absorbing pigment;
a compound represented by Formula (1) described later;
a primary to tertiary amine compound having a molecular weight of 500 or less and a boiling point of 300° C. or lower;
a resin; and
a solvent,
in which the compound represented by Formula (1) described later has a solubility in propylene glycol methyl ether acetate at 25° C. of 0.1 g/L or higher, and
a content of the amine compound in a total solid content of the composition is 10 to 5000 mass ppm.

The composition according to the embodiment of the present invention can form a film in which defects are suppressed. The reason why this effect is obtained is presumed to be as follows. Since the composition according to the embodiment of the present invention includes a near infrared absorbing pigment, a compound (hereinafter, also referred to as a compound (1)) represented by Formula (1) described later, and a resin, a network of the near infrared absorbing pigment-compound (1)-resin is easily formed in the composition, and dispersibility of the near infrared absorbing pigment in the composition is good. In addition, since the compound having the structure of the compound (1) includes a site represented by $X^1$, aggregation or precipitation tends to easily occur in the composition. However, since the solubility of this compound (1) is 0.1 g/L or higher, the compound (1) can be appropriately dissolved in the solvent or the like included in the composition. Therefore, it is presumed that generation of foreign matters caused by the compound (1) can be suppressed during storage of the composition. In addition, since the composition according to the embodiment of the present invention contains, in a proportion described above, the primary to tertiary amine compound (hereinafter, also referred to as an amine compound A) having a molecular weight of 500 or less and a boiling point of 300° C. or lower, it is presumed that, even in a case where the foreign matters caused by the compound (1) are generated during storage of the composition, it is possible to appropriately form an amine salt of the amine compound A and the compound (1), so that the foreign matters caused by the compound (1) can be further reduced. Therefore, the composition according to the embodiment of the present invention can form a film in which defects are suppressed. In a case where the content of the amine compound A is more than the range specified in the present invention, the generation of foreign matters cannot be sufficiently suppressed. It is presumed that the reason for this is that the amine salt grows too much and can be a foreign matter.

<<Near Infrared Absorbing Pigment>>

The composition according to the embodiment of the present invention contains a near infrared absorbing pigment. The near infrared absorbing pigment may be either an inorganic pigment or an organic pigment, and from the reason that the effects of the present invention can be obtained more remarkably, an organic pigment is preferable. The organic pigment is a pigment composed of an organic compound. The near infrared absorbing pigment is preferably a pigment having a maximum absorption wavelength in a near infrared range (preferably in a range of 700 to 1800 nm, more preferably in a range of 700 to 1300 nm, and still more preferably in a range of 700 to 1000 nm).

Examples of a near infrared absorbing pigment as the inorganic pigment (near infrared absorbing inorganic pigment) include metal oxides and metal borides. Examples of the metal oxides include indium tin oxide, antimonthine oxide, zinc oxide, Al-doped zinc oxide, fluorine-doped tin dioxide, niobium-doped titanium dioxide, and tungsten oxide. The details of the tungsten oxide can be found in paragraph "0080" of JP2016-006476A, the content of which is incorporated herein by reference. Examples of the metal borides include lanthanum hexaboride. Examples of a commercially available product of the lanthanum hexaboride include $LaB_6$-F (manufactured by JAPAN NEW METALS CO., LTD.). In addition, as the metal boride, compounds described in WO2017/119394A can also be used. Examples of a commercially available product of the indium tin oxide include F-ITO (manufactured by DOWA HIGHTECH CO., LTD.).

Examples of a near infrared absorbing pigment as the organic pigment (near infrared absorbing organic pigment) include a pyrrolopyrrole compound, a polymethine compound, a diimonium compound, a dithiolene compound, a phthalocyanine compound, a porphyrin compound, an azo compound, a triarylmethane compound, and a perylene compound. Examples of the polymethine compound include a cyanine compound, a squarylium compound, a croconium compound, and an oxonol compound.

As the near infrared absorbing pigment used in the present invention, at least one selected from a pyrrolopyrrole compound, a polymethine compound, a diimonium compound, a dithiolene compound, a phthalocyanine compound, a porphyrin compound, an azo compound, a triarylmethane compound, and a perylene compound is preferable, at least one selected from a pyrrolopyrrole compound, a polymethine compound, a phthalocyanine compound, a naphthalocyanine compound, and a diimonium compound is more preferable, a pyrrolopyrrole compound or a polymethine compound is still more preferable, and a pyrrolopyrrole compound is particularly preferable. As the pyrrolopyrrole compound, a compound represented by Formula (PP) is preferable.

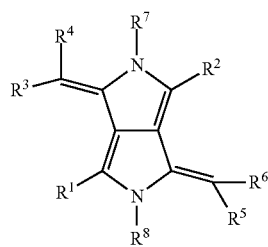

(PP)

In Formula (PP), $R^1$ and $R^2$ each independently represent an alkyl group, an aryl group, or a heteroaryl group, $R^3$, $R^4$, $R^5$, and $R^6$ each independently represent a cyano group, an acyl group, an alkoxycarbonyl group, an alkylsulfinyl group, an arylsulfinyl group, or a heteroaryl group, $R^7$ and $R^8$ each independently represent a hydrogen atom, an alkyl group, an aryl group, a heteroaryl group, $-BR^9R^{10}$, or a metal atom, $R^7$ may be covalently or coordinately bonded to $R^2$, $R^3$, or $R^4$, and $R^8$ may be covalently or coordinately bonded to $R^1$, $R^5$, or $R^6$, in which $R^9$ and $R^{10}$ each independently represent a hydrogen atom, a halogen atom, an alkyl group, an aryl group, a heteroaryl group, an alkoxy group, an aryloxy group, or a heteroaryloxy group, and $R^9$ and $R^{10}$ may be bonded to each other to form a ring.

In Formula (PP), $R^1$ and $R^2$ each independently represent an alkyl group, an aryl group, or a heteroaryl group, and an aryl group or a heteroaryl group is preferable and an aryl group is more preferable. The number of carbon atoms in the alkyl group represented by $R^1$ to $R^2$ is preferably 1 to 30, more preferably 1 to 20, and still more preferably 1 to 10. The number of carbon atoms in the aryl group represented by $R^1$ and $R^2$ is preferably 6 to 30, more preferably 6 to 20, and particularly preferably 6 to 12. The number of carbon atoms constituting the ring of the heteroaryl group represented by R' and $R^2$ is preferably 1 to 30 and more preferably 1 or 12. Examples of the type of the heteroatom constituting the ring of the heteroaryl group include a nitrogen atom, an oxygen atom, and a sulfur atom. The number of heteroatoms constituting the ring of the heteroaryl group is preferably 1 to 3 and more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings. The above-described alkyl group, aryl group, and heteroaryl group may have a substituent or may be unsubstituted, but it is preferable to have a substituent. Examples of the substituent include the substituent T described later.

In Formula (PP), $R^3$, $R^4$, $R^5$, and $R^6$ each independently represent a cyano group, an acyl group, an alkoxycarbonyl group, an alkylsulfinyl group, an arylsulfinyl group, or a heteroaryl group. It is preferable that one of $R^3$ and $R^4$ represents a cyano group, an acyl group, an alkoxycarbonyl group, an alkylsulfinyl group, or an arylsulfinyl group, and the other represents a heteroaryl group, and it is more preferable that one of $R^3$ and $R^4$ represents a cyano group and the other represents a heteroaryl group. It is preferable that one of $R^5$ and $R^6$ represents a cyano group, an acyl group, an alkoxycarbonyl group, an alkylsulfinyl group, or an arylsulfinyl group, and the other represents a heteroaryl group, and it is more preferable that one of $R^5$ and $R^6$ represents a cyano group and the other represents a heteroaryl group. The heteroaryl group is preferably a group represented by Formula (A-1) or a group represented by Formula (A-2).

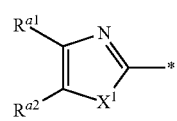

(A-1)

-continued

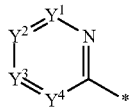
(A-2)

In Formula (A-1), $X^1$ represents O, S, $NR^{X1}$, or $CR^{X2}R^{X3}$, in which $R^{X1}$ to $R^{X3}$ each independently represent a hydrogen atom or a substituent, $R^{a1}$ and $R^{a2}$ each independently represent a hydrogen atom or a substituent, and $R^{a1}$ and $R^{a2}$ may be bonded to each other to form a ring. * represents a linking hand. Examples of the substituent represented by $R^{a1}$, $R^{a2}$, and $R^{X1}$ to $R^{X3}$ include the substituent T described later.

The ring formed by bonding $R^{a1}$ and $R^{a2}$ to each other is preferably an aromatic ring. In a case where $R^{a1}$ and $R^{a2}$ form a ring, examples of (A-1) include a group represented by (A-1-1) and a group represented by (A-1-2).

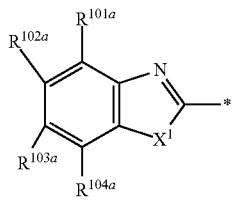
(A-1-1)

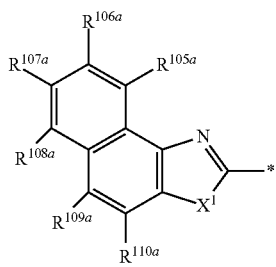
(A-1-2)

In the formulae, $X^1$ represents O, S, $NR^{X1}$, or $CR^{X2}R^{X3}$, in which $R^{X1}$ to $R^{X3}$ each independently represent a hydrogen atom or a substituent, and $R^{101a}$ to $R^{110a}$ each independently represent a hydrogen atom or a substituent. * represents a linking hand. Examples of the substituent represented by $R^{101a}$ to $R^{110a}$ include the substituent T described later.

In Formula (A-2), $Y^1$ to $Y^4$ each independently represent N or $CR^{Y1}$ and at least two of $Y^1$ to $Y^4$ are $CR^{Y1}$, in which $R^{Y1}$ represents a hydrogen atom or a substituent and adjacent $R^{Y1}$'s may be bonded to each other to form a ring. * represents a linking hand. Examples of the substituent represented by $R^{Y1}$ include the substituent T described later, and an alkyl group, an aryl group, or a halogen atom is preferable.

At least two of $Y^1$ to $Y^4$ are $CR^{Y1}$, and adjacent $R^{Y1}$'s may be bonded to each other to form a ring. The ring formed by bonding adjacent $R^{Y1}$'s to each other is preferably an aromatic ring. In a case where adjacent $R^{Y1}$ form a ring, examples of (A-2) include a group represented by (A-2-1) and a group represented by (A-2-2).

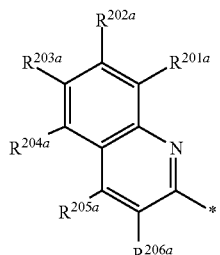
(A-2-1)

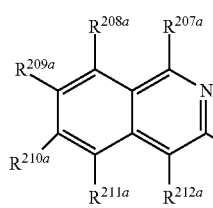
(A-2-2)

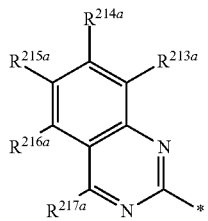
(A-2-3)

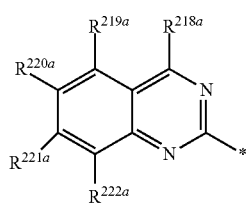
(A-2-4)

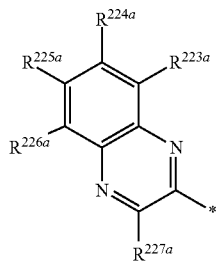
(A-2-5)

In the formulae, $R^{201a}$ to $R^{227a}$ each independently represent a hydrogen atom or a substituent, and * represents a linking hand. Examples of the substituent represented by $R^{201a}$ to $R^{227a}$ include the substituent T described later.

In Formula (PP), $R^7$ and $R^8$ each independently represent a hydrogen atom, an alkyl group, an aryl group, a heteroaryl group, —$BR^9R^{10}$, or a metal atom, and —$BR^9R^{10}$ is preferable. $R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, and a halogen atom, an alkyl group, an aryl group, or a heteroaryl group is preferable, a halogen atom, an alkyl group, or an aryl group is more preferable, and an aryl group is still more preferable. $R^9$ and $R^{10}$ may be bonded to each other to form a ring.

(Substituent T)

Examples of the substituent T include an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfonyl group (preferably an alkylsulfonyl group having 1 to 30 carbon atoms), an arylsulfonyl group (preferably an arylsulfonyl group having 6 to 30 carbon atoms), a heteroarylsulfonyl group (preferably a heteroarylsulfonyl group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a heteroarylsulfinyl group (preferably a heteroarylsulfinyl group having 1 to 30 carbon atoms), a ureido group (preferably a ureido group having 1 to 30 carbon atoms), a phosphate amide group (preferably a phosphate amide group having 1 to 30 carbon atoms), a hydroxyl group, a carboxyl group, a sulfo group, a phosphate group, a mercapto group, a halogen atom, a cyano group, an alkylsulfino group, an arylsulfino group, a hydrazino group, an imino group, and a heteroaryl group (preferably a heteroaryl group having 1 to 30 carbon atoms). In a case where the above-described groups can be further substituted, the groups may further have a substituent. Examples of the further substituent include the groups described regarding the substituent T.

Specific examples of the pyrrolopyrrole compound include the following compounds. In the following structural formulae, Me represents a methyl group and Ph represents a phenyl group. In addition, Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference.

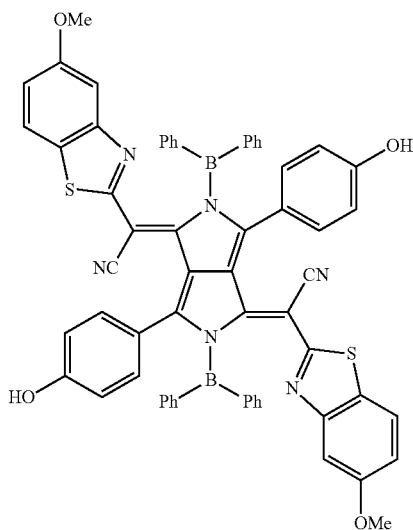

P-1

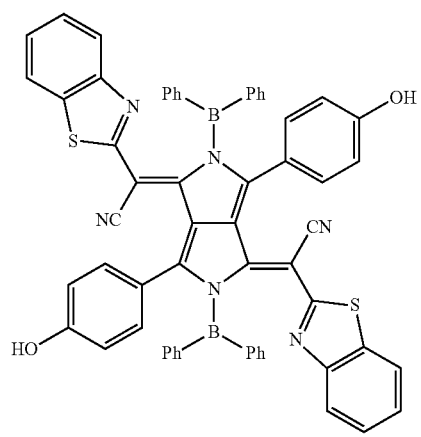

P-2

-continued
P-3
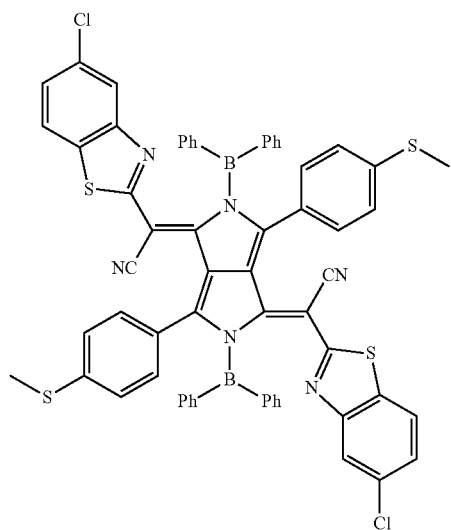
P-4
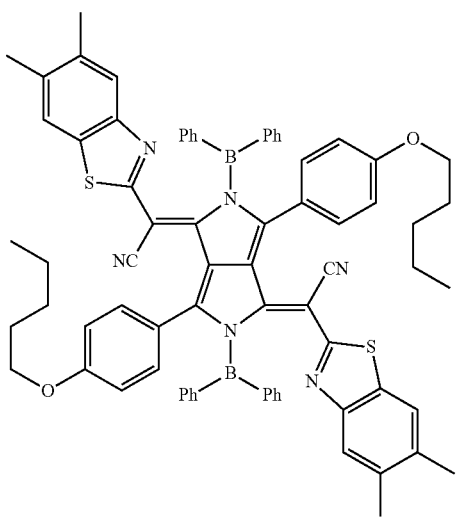
P-5
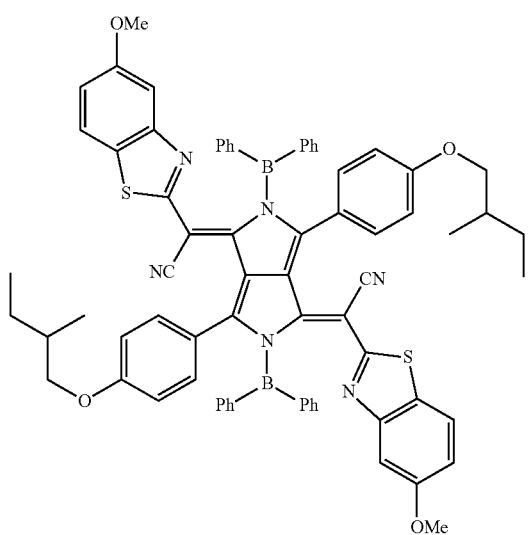
P-6
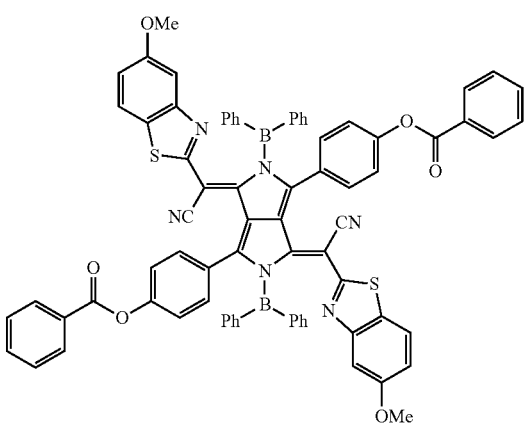
P-7
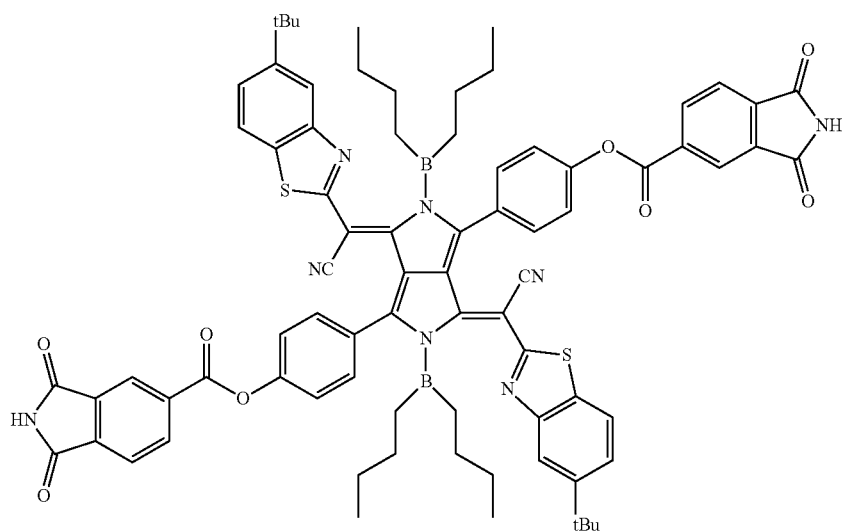

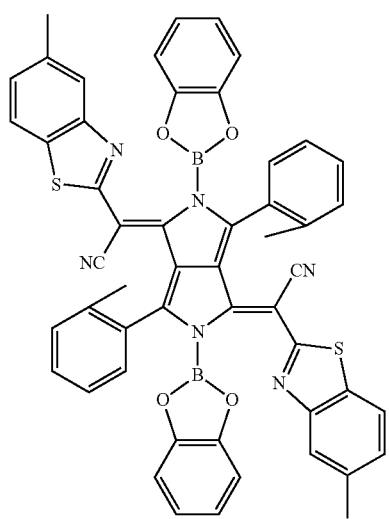
P-8
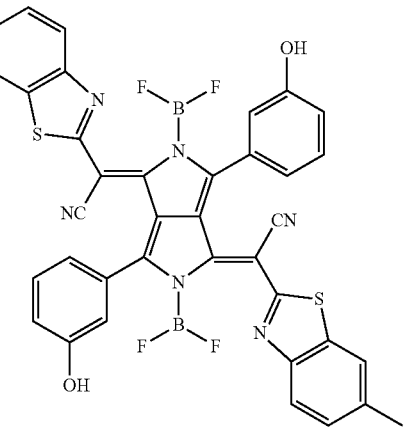
P-9
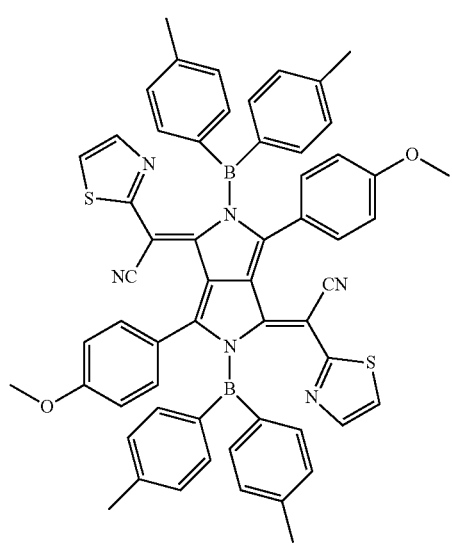
P-10

-continued
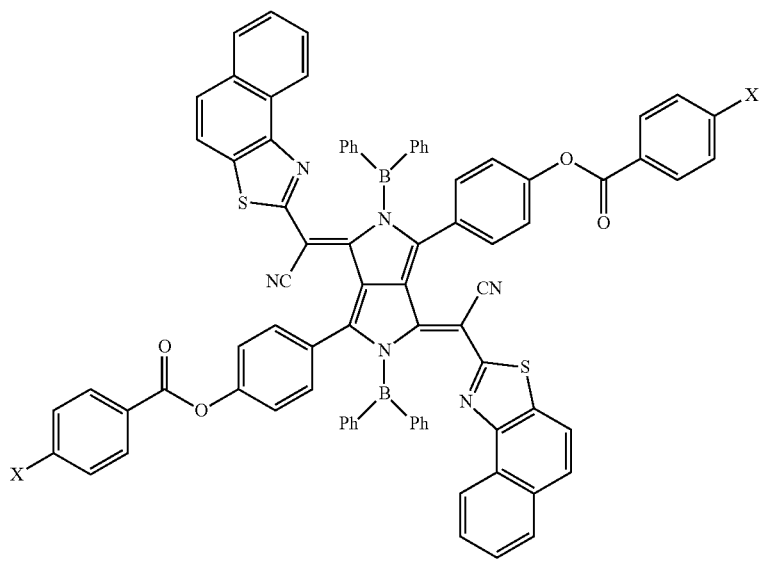
X = Cl    P-11
X = NO$_2$   P-12
X = CN   P-13
X = tBu   P-14
P-15
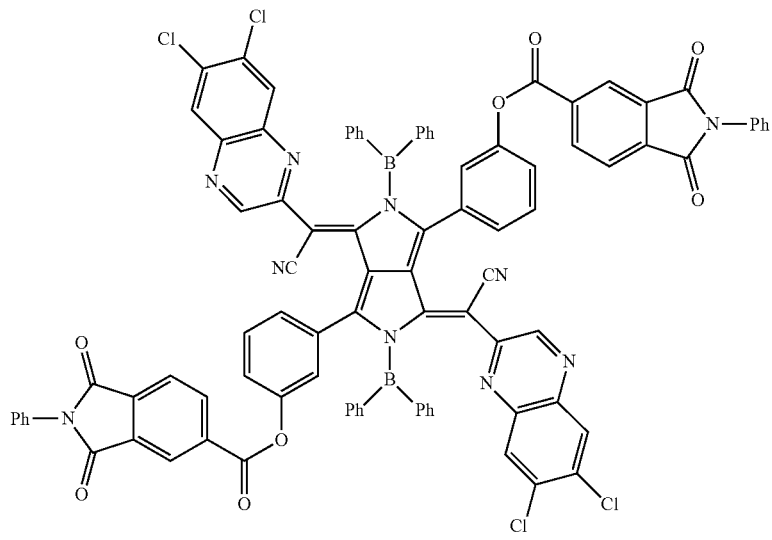
P-16
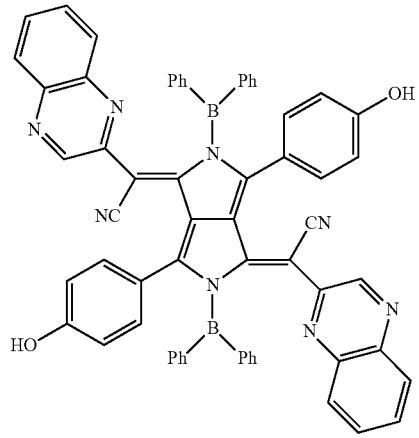
P-17
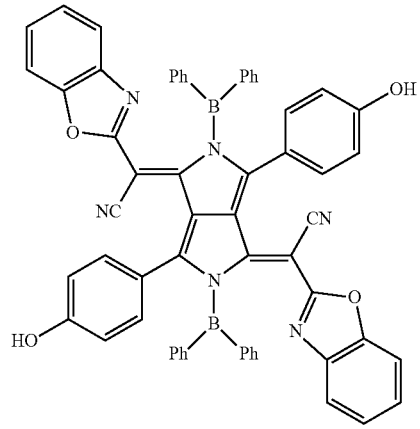

-continued
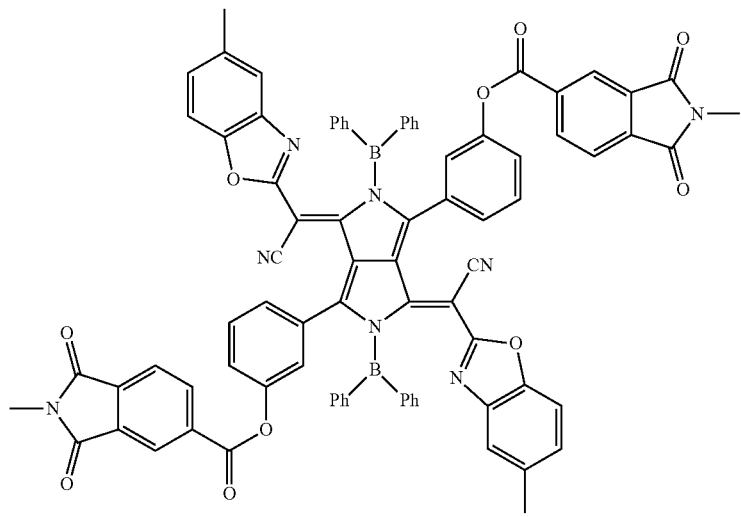
P-18
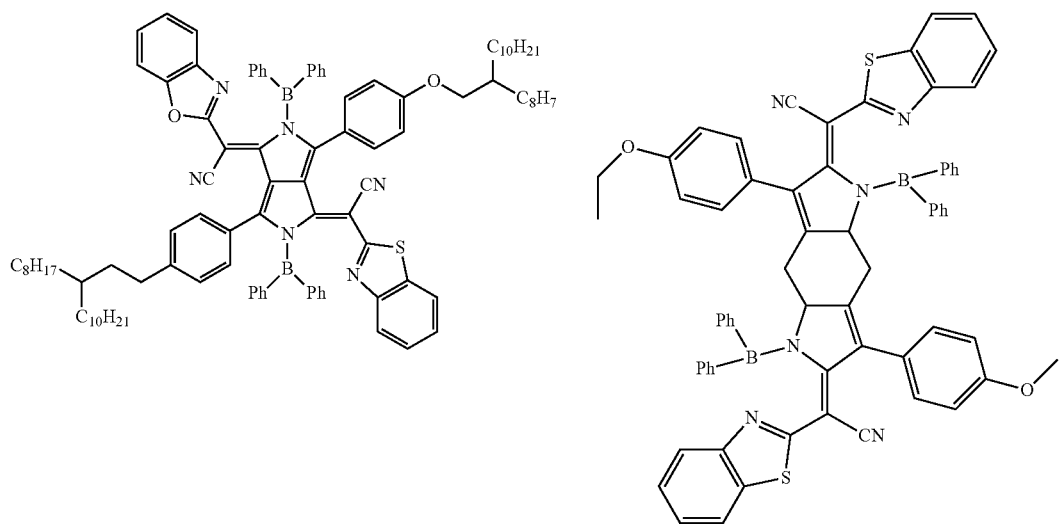
P-19
P-20
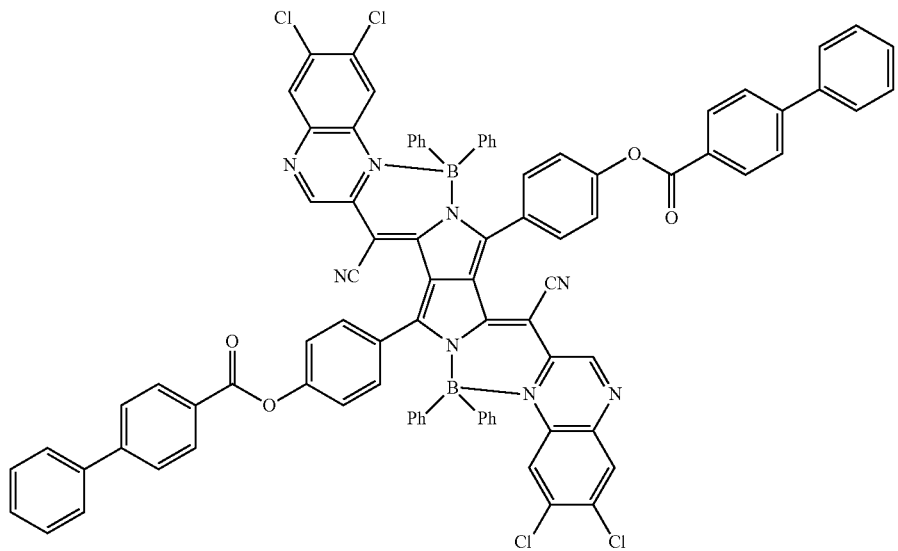
P-21

-continued
P-22
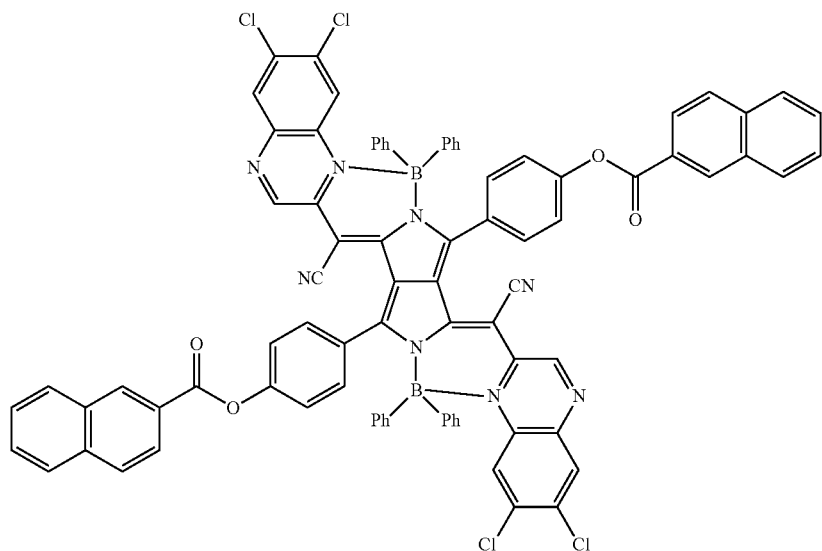
P-23
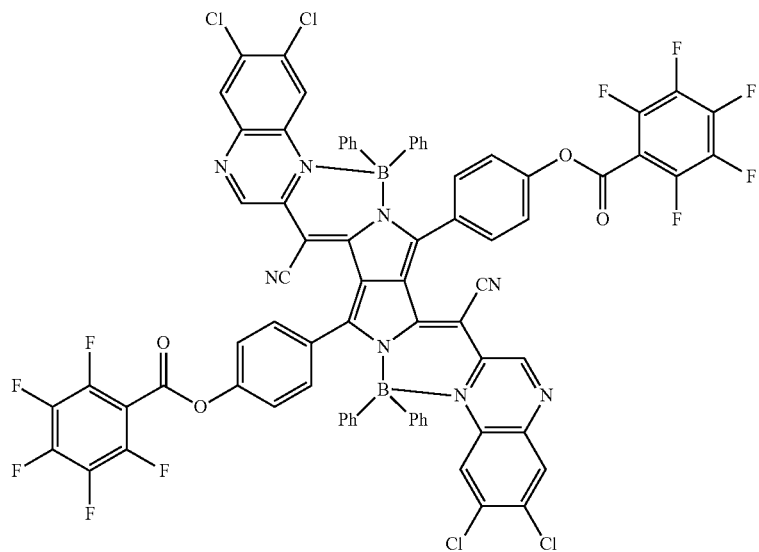
P-24
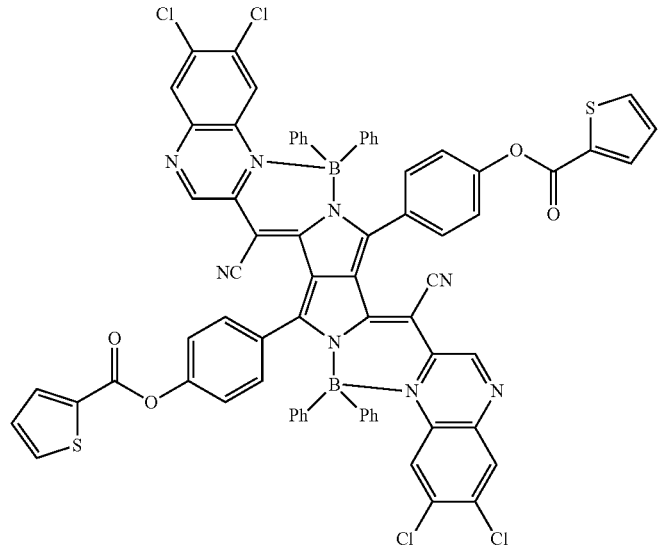

-continued
P-25
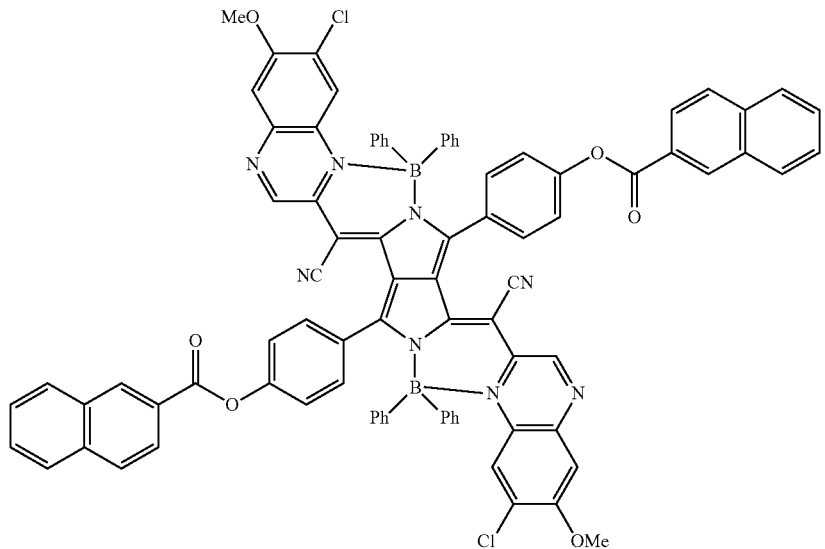
P-26
P-27
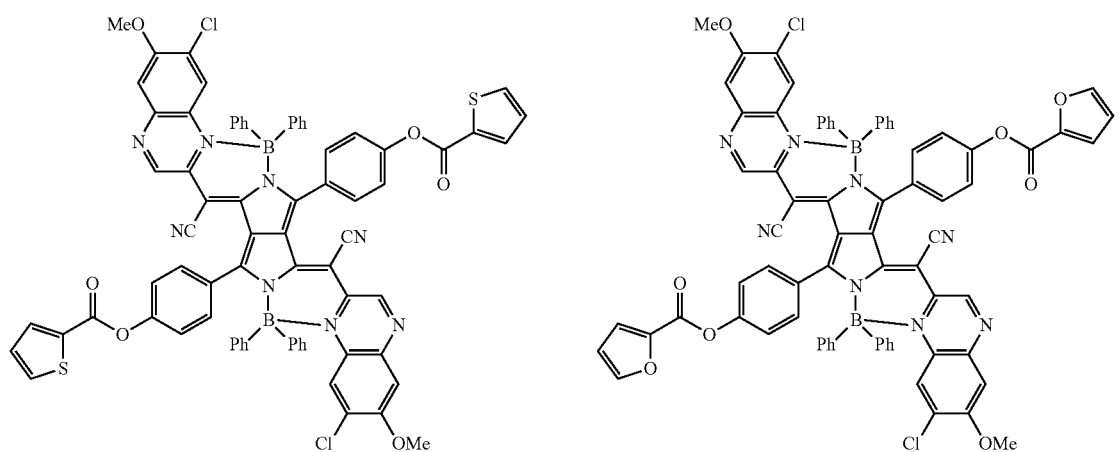
P-28
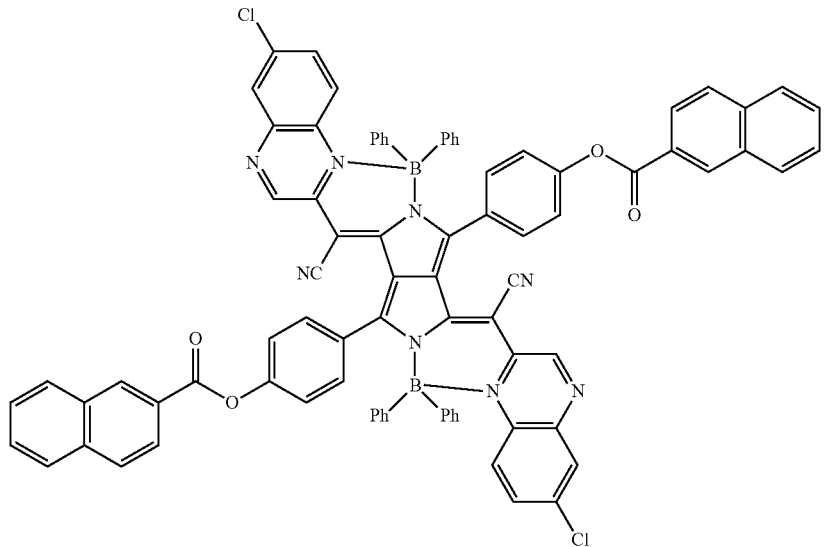

-continued
P-29
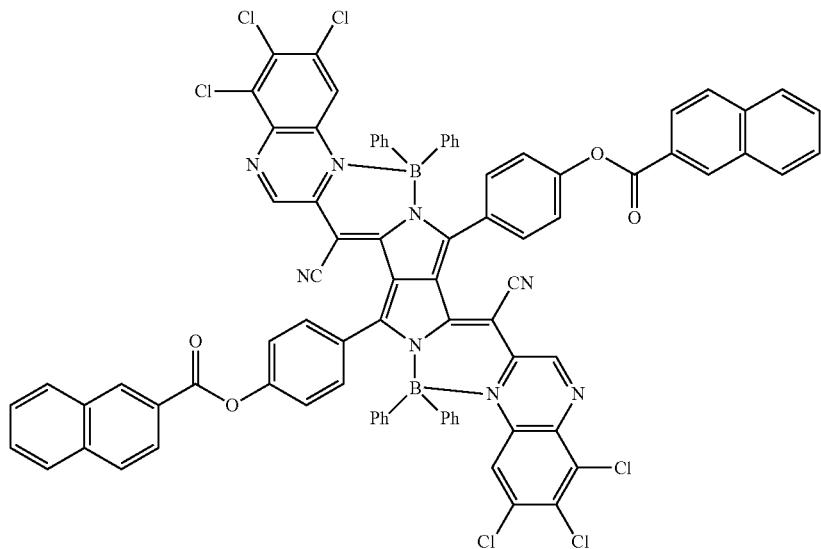
P-30
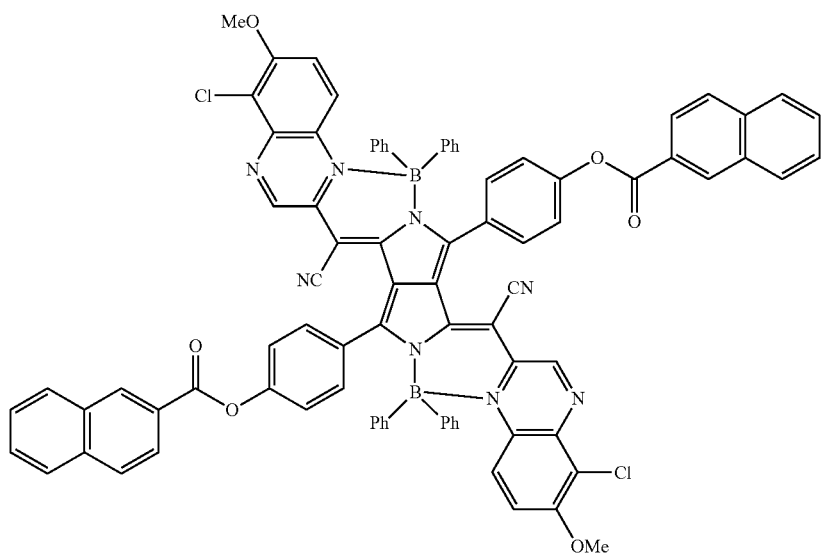
P-31
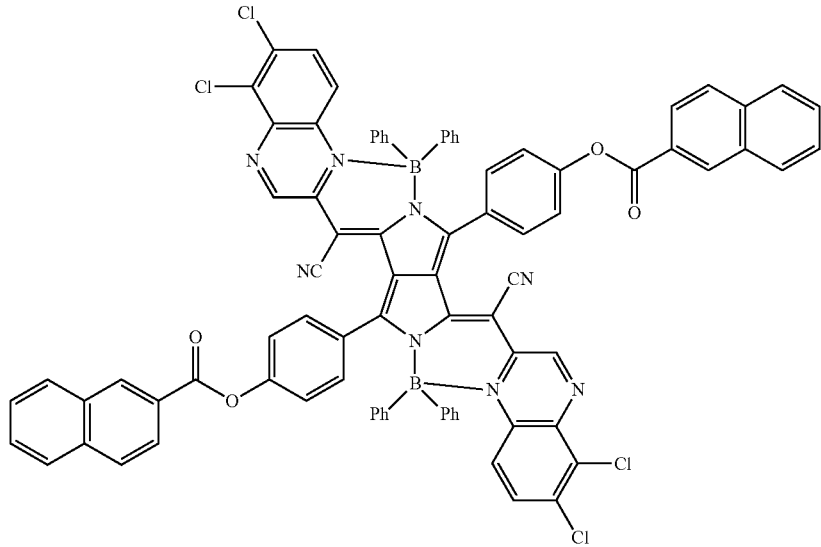

P-32
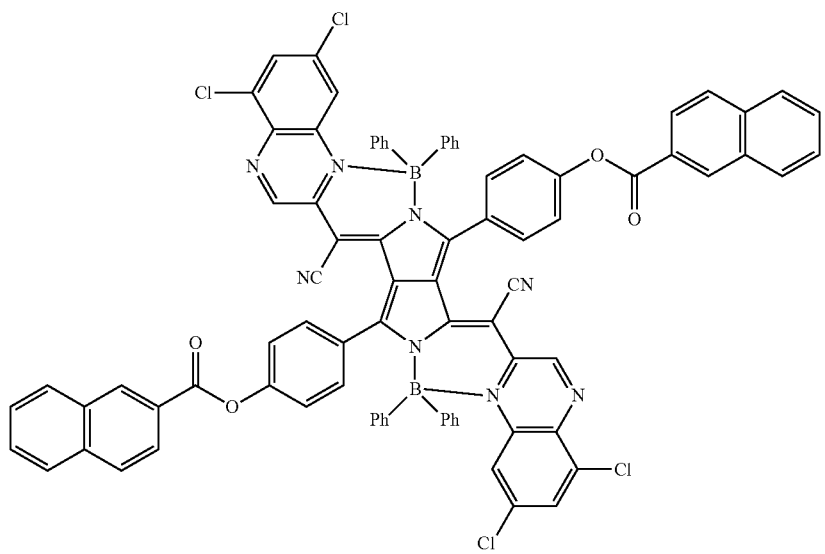
P-33
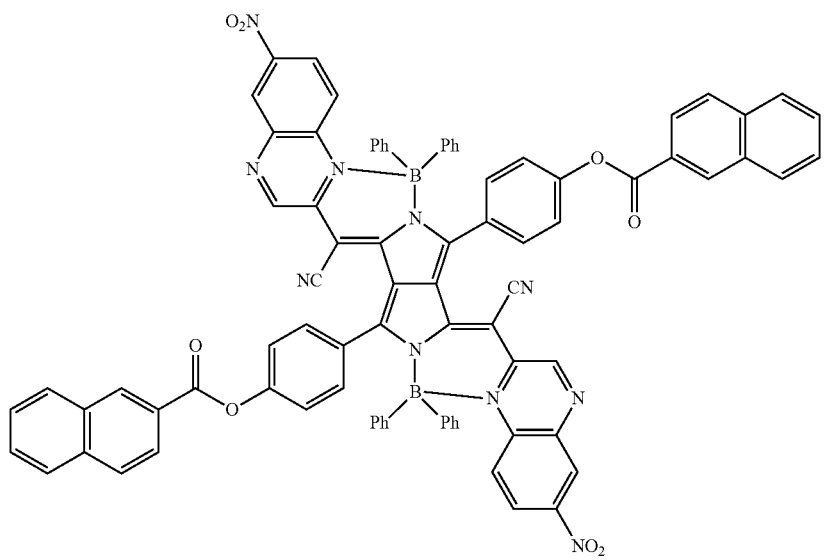
P-34
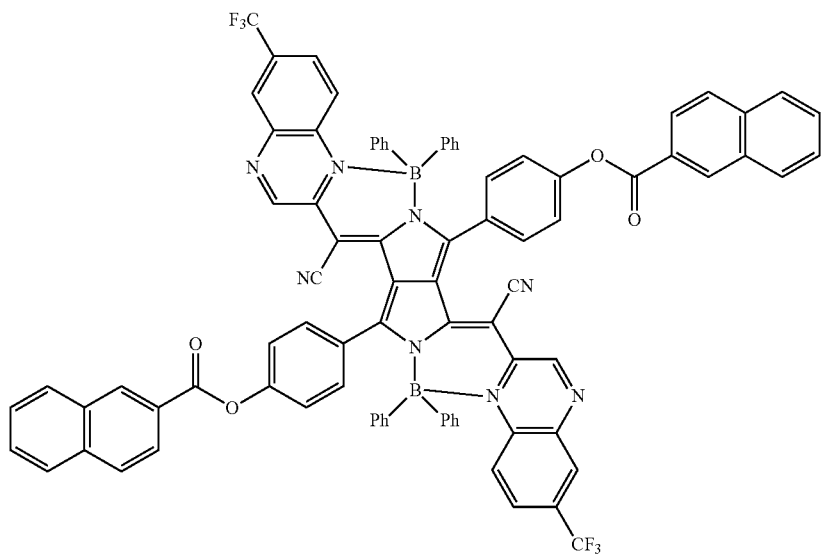

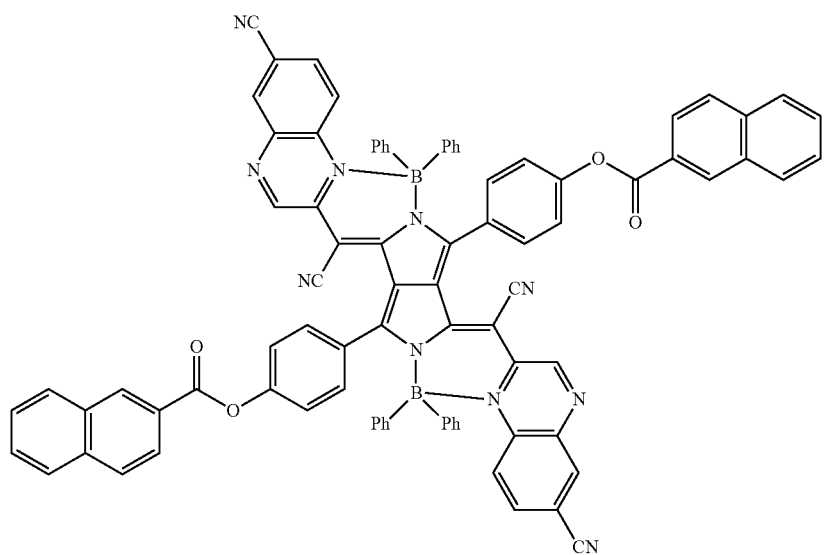
P-35
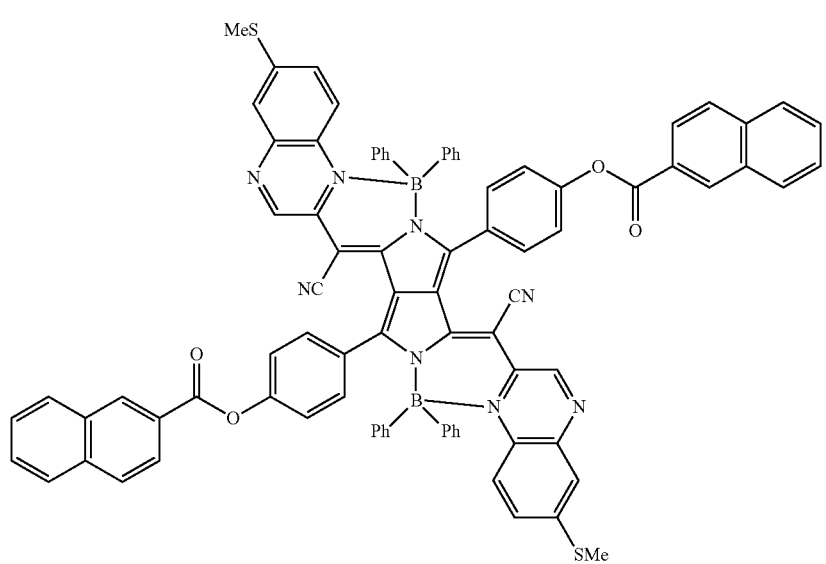
P-36

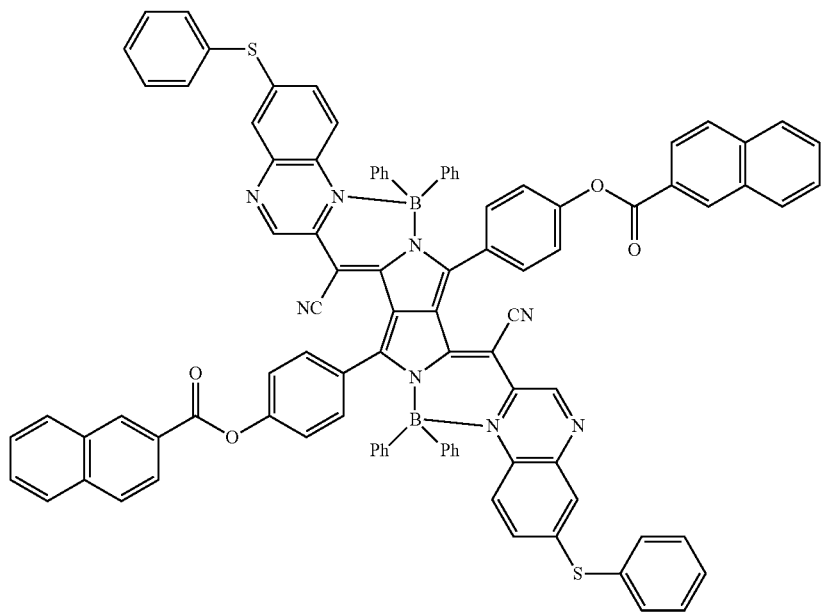
P-37
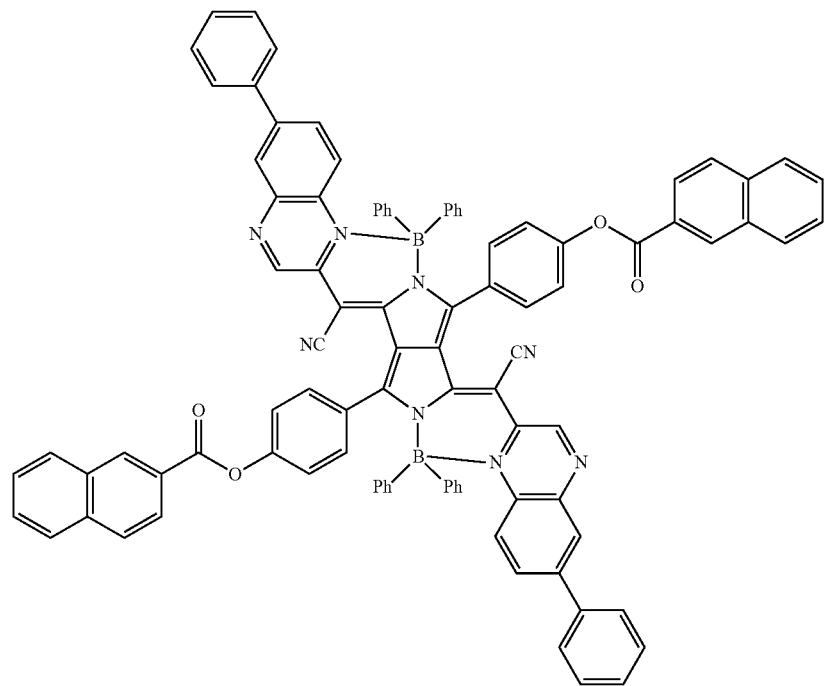
P-38

P-39
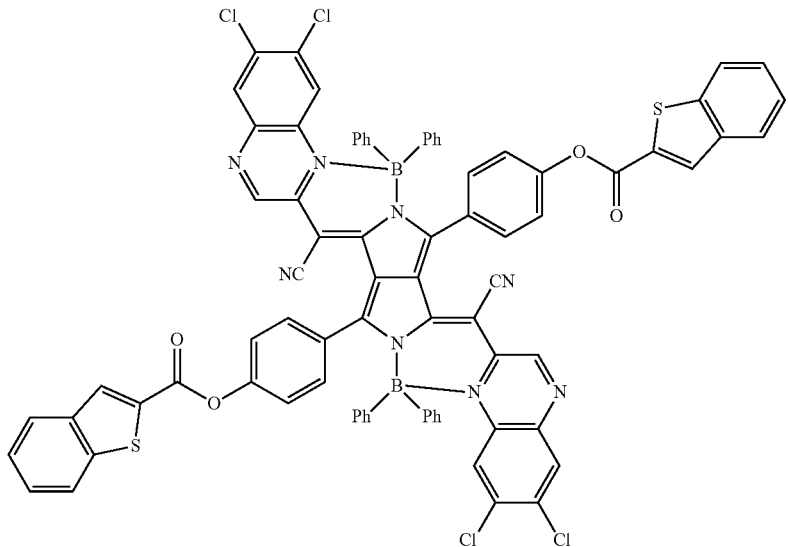
P-40
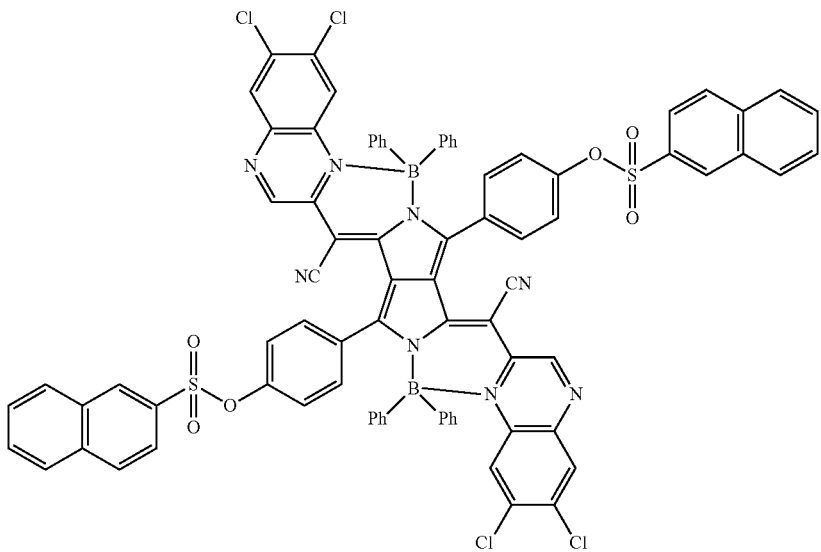
P-41
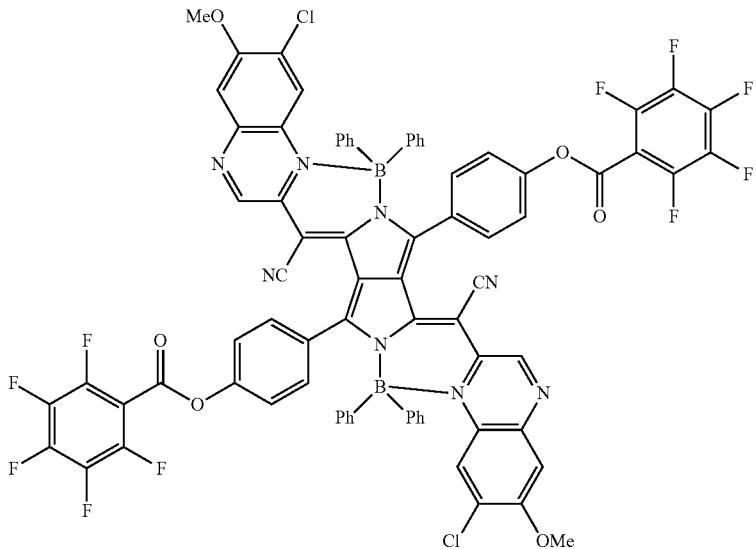

P-42
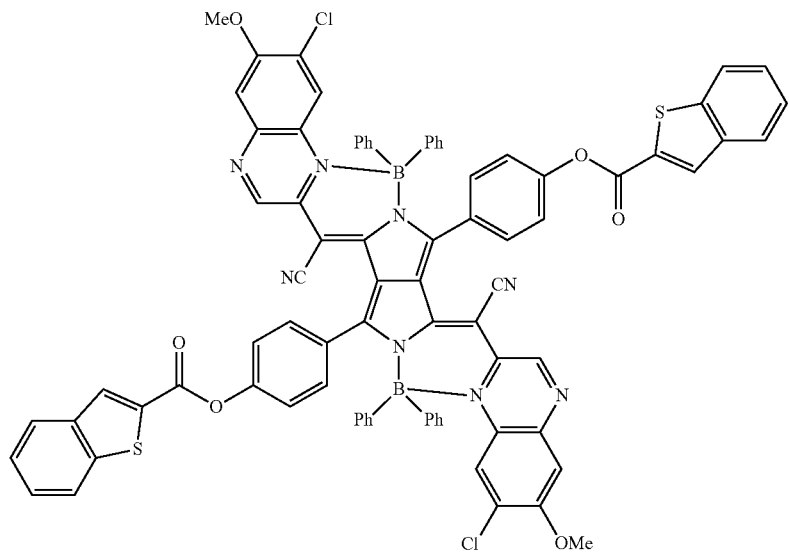
P-43
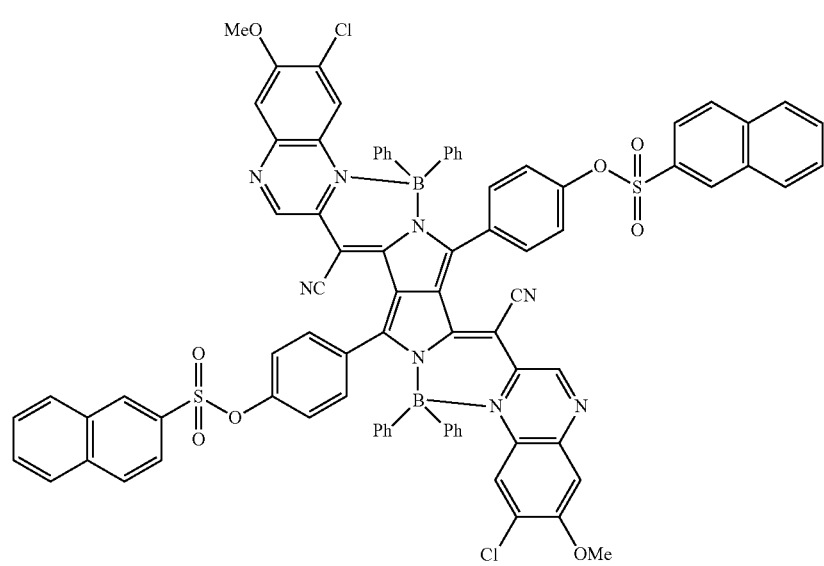

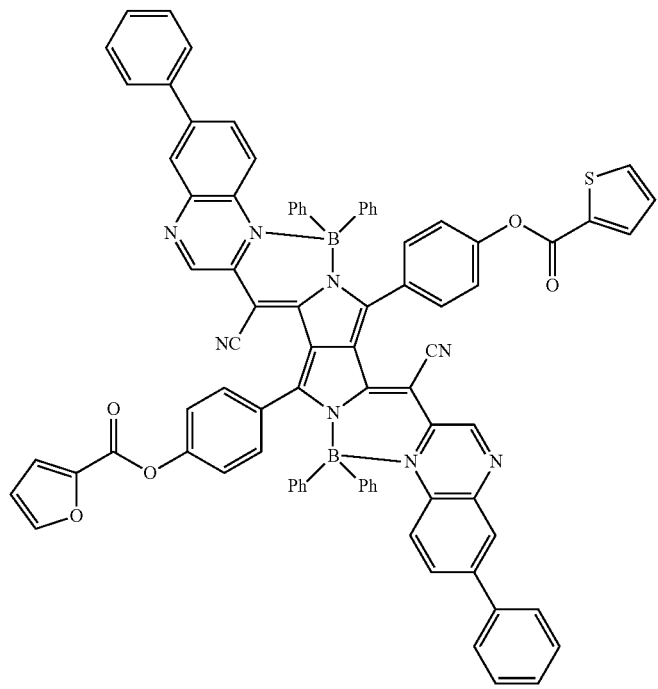
P-44
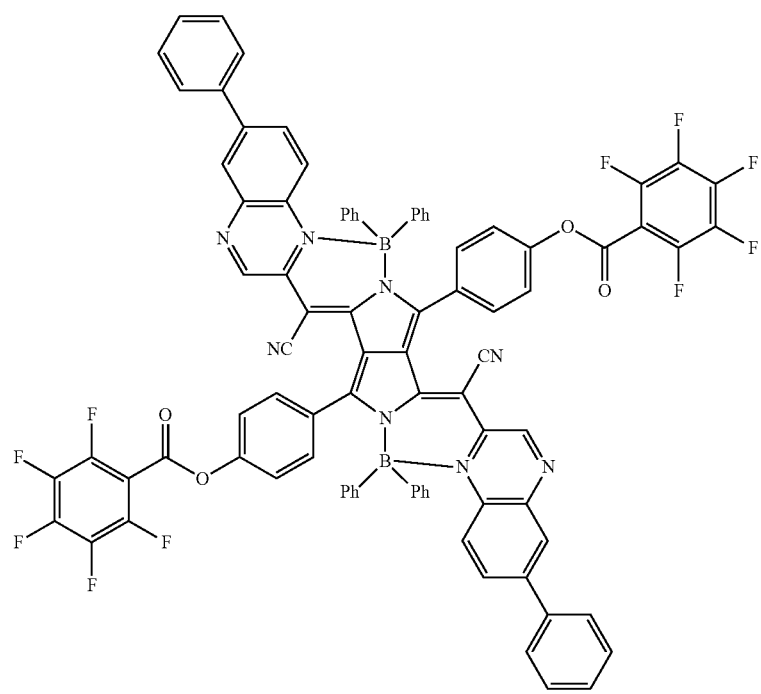
P-45

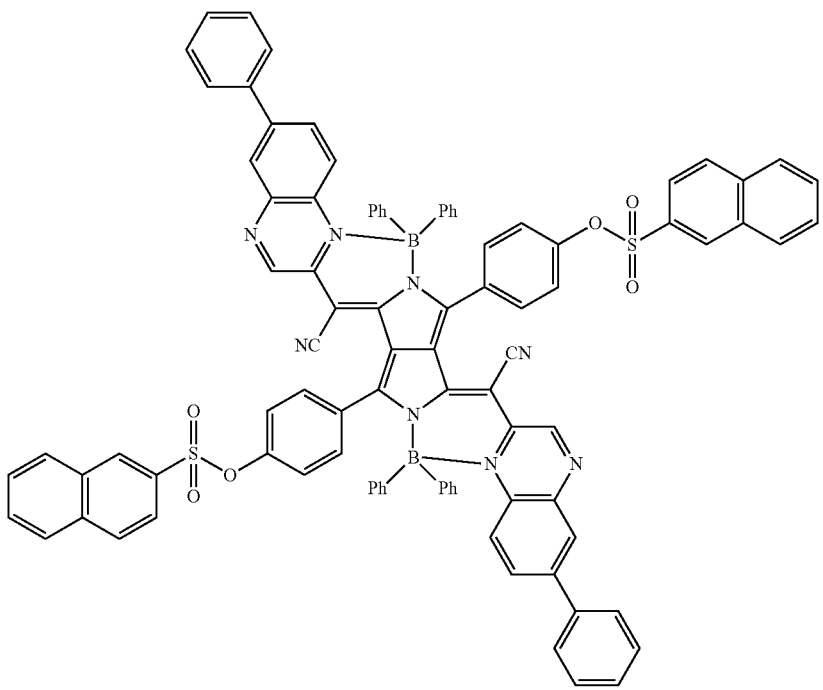

P-46

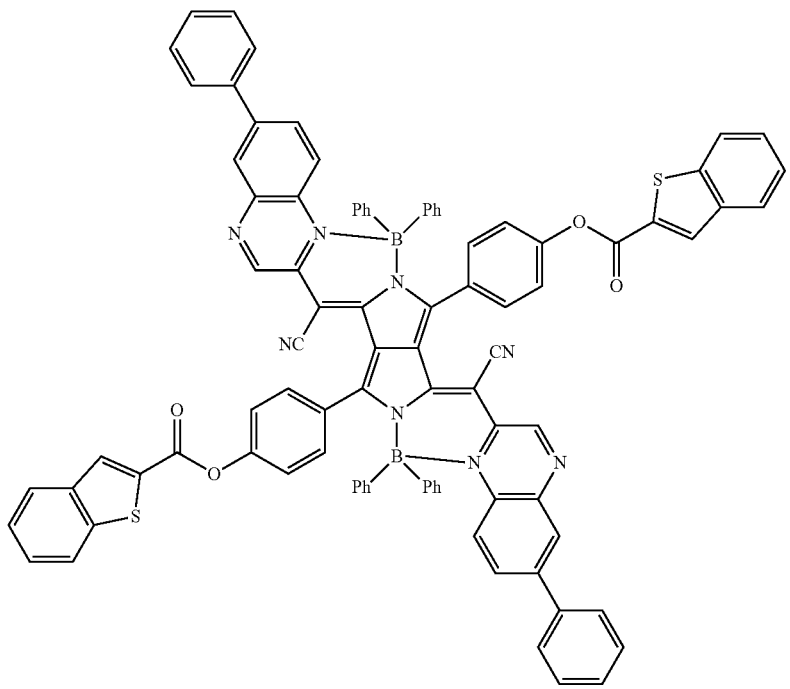

P-47

In addition, as a near infrared absorbing pigment, the squarylium compounds described in JP2017-197437A, the squarylium compounds described in paragraphs "0090" to "0107" of WO2017/213047A, the pyrrole ring-containing compounds described in paragraphs "0019" to "0075" of JP2018-054760A, the pyrrole ring-containing compounds described in paragraphs "0078" to "0082" of JP2018-040955A, the pyrrole ring-containing compounds described in paragraphs "0043" to "0069" of JP2018-002773A, the squarylium compounds having an aromatic ring at the α-amide position described in paragraphs "0024" to "0086" of JP2018-041047A, the amide-linked squarylium compounds described in JP2017-179131A, the compounds having a pyrrole bis-type squarylium skeleton or a croconium skeleton described in JP2017-141215A, the dihydrocarbazole bis-type squarylium compounds described in JP2017-082029, the asymmetric compounds described in paragraphs "0027" to "0114" of JP2017-068120A, the pyrrole ring-containing compounds (carbazole type) described in JP2017-067963A, the phthalocyanine compounds described in JP6251530B, the compounds described in paragraphs "0048" to "0063" of WO2018/043564A, and the like can also be used.

It is preferable that the solubility of the near infrared absorbing pigment in propylene glycol methyl ether acetate at 25° C. is lower than the solubility of the compound (compound (1)) represented by Formula (1) in propylene glycol methyl ether acetate at 25° C.

In addition, the solubility of the near infrared absorbing pigment in propylene glycol methyl ether acetate at 25° C. is preferably 0.1 g/L or lower, more preferably 0.01 g/L or lower, and still more preferably 0.005 g/L or lower. The lower limit is not particularly limited, but may be 0.01 mg/L or higher and is preferably 0.1 mg/L or higher. In a case where the solubility of the near infrared absorbing pigment is 0.1 g/L or lower, a film having excellent heat resistance and light resistance can be formed. Furthermore, dispersibility of the near infrared absorbing pigment in the composition is also good.

The content of the near infrared absorbing pigment in the total solid content of the composition is preferably 0.1 to 50 mass %. The lower limit is more preferably 0.5 mass % or higher, still more preferably 1 mass % or higher, and even more preferably 5 mass % or higher. The upper limit is more preferably 30 mass % or lower, and still more preferably 15 mass % or lower.

<<Compound (1)>>

The composition according to the embodiment of the present invention contains a compound (hereinafter, also referred to as the compound (1)) represented by Formula (1).

$$P^1(-L^1-(X^1)_n)_m \quad (1)$$

In Formula (1), $P^1$ represents a colorant structure, $L^1$ represents a single bond or a linking group, $X^1$ represents an acid group, a basic group, a group having a salt structure, or a phthalimide methyl group, m represents an integer of 1 or more, n represents an integer of 1 or more, in a case where m represents 2 or more, a plurality of L's and a plurality of $X^1$'s may be different from each other, and in a case where n represents 2 or more, a plurality of $X^1$'s may be different from each other.

$P^1$ in Formula (1) is preferably a colorant structure selected from the group consisting of a pyrrolopyrrole colorant structure, a polymethine colorant structure, a diimonium colorant structure, a dithiolene colorant structure, a phthalocyanine colorant structure, a porphyrin colorant structure, an azo colorant structure, a triarylmethane colorant structure, a perylene colorant structure, and a quinacridone colorant structure; more preferably a colorant structure selected from the group consisting of a pyrrolopyrrole colorant structure and a polymethine colorant structure; and still more preferably a pyrrolopyrrole colorant structure.

In addition, $P^1$ in Formula (1) is also preferably a colorant structure derived from a near infrared absorbing colorant. The near infrared absorbing colorant is preferably a compound having a maximum absorption wavelength in a near infrared range (preferably in a range of 700 to 1800 nm, more preferably in a range of 700 to 1300 nm, and still more preferably in a range of 700 to 1000 nm). Examples of such a compound include a pyrrolopyrrole compound, a polymethine compound, a diimonium compound, a dithiolene compound, a phthalimide compound, a porphyrin compound, an azo compound, a triarylmethane compound, and a perylene compound. Examples of the polymethine compound include a cyanine compound, a squarylium compound, a croconium compound, and an oxonol compound.

$P^1$ in Formula (1) is preferably a colorant structure having a skeleton common to the near infrared absorbing pigment. According to this aspect, the near infrared absorbing pigment is easily adsorbed on the compound (1), and the dispersibility of the near infrared absorbing pigment in the composition can be enhanced.

$L^1$ in Formula (1) represents a single bond or a linking group, and a linking group is preferable. Examples of the linking group include a hydrocarbon group, a heterocyclic group, —O—, —S—, —CO—, —COO—, —OCO—, —SO$_2$—, —NR$^L$—, —NR$^L$CO—, —CONR$^L$—, —NR$^L$SO$_2$—, —SO$_2$NR$^L$—, and a group consisting of a combination thereof, in which R$^L$ represents a hydrogen atom, an alkyl group, or an aryl group. The hydrocarbon group may be an aliphatic hydrocarbon group or an aromatic hydrocarbon group. Examples of the hydrocarbon group include an alkylene group, an arylene group, and a group obtained by removing one or more hydrogen atoms from these groups. The number of carbon atoms in the alkylene group is preferably 1 to 30, more preferably 1 to 15, and still more preferably 1 to 10. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10. The heterocyclic group is preferably monocyclic or a fused ring having 2 to 4 fused rings. The number of heteroatoms constituting the ring of the heterocyclic group is preferably 1 to 3. As the heteroatom constituting the ring of the heterocyclic group, a nitrogen atom, an oxygen atom, or a sulfur atom is preferable. The number of carbon atoms constituting the ring of the heterocyclic group is preferably 3 to 30, more preferably 3 to 18, and still more preferably 3 to 12. The heterocyclic group is preferably a nitrogen-containing heterocyclic ring group. The hydrocarbon group and heterocyclic group may have a substituent. Examples of the substituent include the groups described above as the substituent T. In addition, the number of carbon atoms in the alkyl group represented by $R^L$ is preferably 1 to 20, more preferably 1 to 15, and still more preferably 1 to 8. The alkyl group may be linear, branched, or cyclic, and is preferably linear or branched and more preferably linear. The alkyl group represented by $R^L$ may further have a substituent. Examples of the substituent include the groups described above as the substituent T. The number of carbon atoms in the aryl group represented by $R^L$ is preferably 6 to 30, more preferably 6 to 20, and still more preferably 6 to 12. The aryl group represented by $R^L$ may further have a substituent. Examples of the substituent include the groups described above as the substituent T.

$X^1$ in Formula (1) represents an acid group, a basic group, a group having a salt structure, or a phthalimide methyl group, and an acid group is preferable.

Examples of the acid group represented by $X^1$ include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and heterocyclic group represented by R$^{X1}$ to R$^{X6}$ may further have a substituent. As the further substituent, a halogen atom is preferable and a fluorine atom is more preferable.

The acid group represented by $X^1$ in Formula (1) is also preferably an acid group having a pKa of 3 or less and a C log P value of −1.1 or more. The pKa of the above-described acid group is more preferably 2 or less, still more preferably 0 or less, and even more preferably −1 or less. The C log P value of the above-described acid group is more preferably −1 or more, still more preferably 0 or more, and even more preferably 1 or more. As the pKa and C log P value of the acid group, calculated values calculated by replacing a direct bond with a methyl group are used. In addition, the pKa is a value in water, and is obtained by predictive calculation using ACD/Labs, ver 8.08 (manufactured by Advanced Chemistry Development, Inc.). In addition, the C log P value is a calculated value of Log P, which is a common logarithm of partition coefficient P of 1-octanol/water, and is obtained by predictive calculation using ChemiBioDrow Ultra, ver 13.0.2.3021 (manufactured by Cambridge Soft).

As the acid group having a pKa of 3 or less and a C log P value of −1.1 or more, at least one group selected from a group represented by Formula (X-10), a group represented by Formula (X-20), and a group represented by Formula (X-30) is preferable, and a group represented by Formula (X-10) is more preferable.

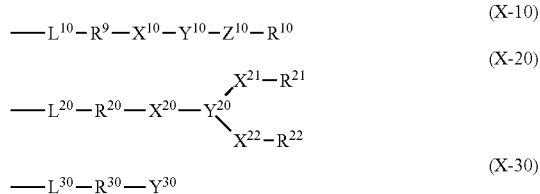

In Formula (X-10), $L^{10}$ represents a single bond or a divalent linking group. Examples of the divalent linking group represented by $L^{10}$ include —O—, —S—, —CO—, —COO—, —OCO—, —SO$_2$—, —NH—, —NHCO—, an alkylene group, an arylene group, a heterocyclic group, and a combination thereof.

In Formula (X-10), $X^{10}$ and $Z^{10}$ each independently represent —SO$_2$—, —CO—, —B(OH)—, or —P(=O)(OH)—. Among these, it is preferable that at least one of $X^{10}$ and $Z^{10}$ is —SO$_2$—, it is more preferable that one of $X^{10}$ and $Z^{10}$ is —SO$_2$— and the other is —SO$_2$— or —CO—, it is still more preferable that one of $X^{10}$ and $Z^{10}$ is —SO$_2$— and the other is —CO—, and it is particularly preferable that $X^{10}$ is —CO— and $Z^{10}$ is —SO$_2$—.

In Formula (X-10), $Y^{10}$ represents —NH—.

In Formula (X-10), $R^9$ represents a single bond or a hydrocarbon group having 1 or more carbon atoms, which may have a substituent, and $R^{10}$ represents a halogen atom, a hydroxyl group, or a hydrocarbon group having 1 or more carbon atoms, which may have a substituent. The hydrocarbon group represented by $R^9$ and $R^{10}$ may be an aliphatic hydrocarbon group or an aromatic hydrocarbon group. In addition, the aliphatic hydrocarbon group may be linear, branched, or cyclic. The number of carbon atoms of the aliphatic hydrocarbon group is preferably 1 to 30. The upper limit is more preferably 25 or less, still more preferably 20 or less, and even more preferably 15 or less. The lower limit is more preferably 2 or more, still more preferably 3 or more, and even more preferably 4 or more. The number of carbon atoms of the aromatic hydrocarbon group is preferably 6 to 20. The upper limit is more preferably 18 or less, still more preferably 15 or less, and even more preferably 12 or less.

Examples of the substituent which may be included in the hydrocarbon group represented by $R^9$ and $R^{10}$ include a halogen atom, a hydroxyl group, a carboxyl group, an alkoxy group, a phenoxy group, an acyl group, and a sulfo group. The alkoxy group may be substituted with halogen atoms in at least a part of hydrogen atoms. As the above-mentioned substituent, a halogen atom or an alkoxy group which may be substituted with halogen atoms in at least a part of hydrogen atoms is preferable, a halogen atom or an alkoxy group which is substituted with halogen atoms in at least a part of hydrogen atoms is more preferable, and a halogen atom is still more preferable. In addition, as the halogen atom, a chlorine atom, a fluorine atom, or a bromine atom is preferable, and a fluorine atom is more preferable.

In Formula (X-20), $L^{20}$ represents a single bond or a divalent linking group. Examples of the divalent linking group represented by $L^{20}$ include the groups described in $L^{10}$ of Formula (X-10), and the preferred range is also the same.

In Formula (X-20), $X^{20}$ to $X^{22}$ each independently represent —SO$_2$—, —CO—, —B(OH)—, or —P(=O)(OH)—, and it is preferable that $X^{20}$ to $X^{22}$ each independently represent —SO$_2$— or —CO—. In addition, it is preferable that at least one of $X^{20}$ to $X^{22}$ represents —SO$_2$—, and it is more preferable that $X^{20}$ to $X^{22}$ each independently represent —SO$_2$—.

In Formula (X-20), $Y^{20}$ represents —CH<.

In Formula (X-20), $R^{20}$ represents a single bond or a hydrocarbon group having 1 or more carbon atoms, which may have a substituent, and $R^{21}$ and $R^{22}$ each independently represent a halogen atom, a hydroxyl group, or a hydrocarbon group having 1 or more carbon atoms, which may have a substituent. Examples of the hydrocarbon group represented by $R^{20}$ to $R^{22}$ and the substituent which may be included in the hydrocarbon group represented by $R^{20}$ to $R^{22}$ include the groups described as the hydrocarbon groups represented by $R^9$ and $R^{10}$ in Formula (X-10) and the substituent which may be included in the hydrocarbon group represented by $R^9$ and $R^{10}$, and the preferred ranges are also the same.

In Formula (X-30), $L^{30}$ represents a single bond or a divalent linking group. Examples of the divalent linking group represented by $L^{30}$ include the groups described in $L^{10}$ of Formula (X-10), and the preferred range is also the same.

In Formula (X-30), $R^{30}$ represents a hydrocarbon group having 1 or more carbon atoms, which may have a substituent. Examples of the hydrocarbon group represented by $R^{30}$ and the substituent which may be included in the hydrocarbon group represented by $R^{30}$ include the groups described as the hydrocarbon groups represented by $R^9$ and $R^{10}$ in Formula (X-10) and the substituent which may be included in the hydrocarbon group represented by $R^9$ and $R^{10}$, and the preferred ranges are also the same.

In Formula (X-30), $Y^{30}$ represents —COOH, —SO$_3$H, or —B$^-$(Rb1)(Rb2)(Rb3), in which Rb1 to Rb3 each independently represent a halogen atom or a hydrocarbon group having 1 or more carbon atoms, which may have a substituent. As the halogen atom represented by Rb1 to Rb3, a chlorine atom, a fluorine atom, or a bromine atom is preferable, and a fluorine atom is more preferable. Examples of the hydrocarbon group represented by Rb1 to Rb3 and the substituent which may be included in the hydrocarbon group represented by Rb1 to Rb3 include the groups described as the hydrocarbon groups represented by $R^9$ and $R^{10}$ in Formula (X-10) and the substituent which may be included in the hydrocarbon group represented by $R^9$ and $R^{10}$, and the preferred ranges are also the same.

Examples of the basic group represented by $X^1$ in Formula (1) include an amino group and a pyridyl group. Examples of the amino group include —$NH_2$, a dialkylamino group, an alkylarylamino group, a diarylamino group, and a cyclic amino group. The dialkylamino group, alkylarylamino group, diarylamino group, and cyclic amino group may further have a substituent. Examples of the further substituent include the groups described above as the substituent T.

The phthalimide methyl group represented by $X^1$ in Formula (1) may have a substituent or may be unsubstituted. Examples of the substituent include the groups described above as the substituent T.

Examples of the group having a salt structure, represented by $X^1$ in Formula (1), include a salt of an acid group and a salt of a basic group. In a case where the salt structure is a salt of an acid group, examples of atoms or atomic group constituting the salt include an alkali metal ion (such as $Li^+$, $Na^+$, and $K^+$), an ammonium-based ion, a pyridine-based ion, an imidazole-based ion, and a sulfonium ion. In a case where the salt structure is a salt of a basic group, examples of atoms or atomic group constituting the salt include a hydroxide ion, a halogen ion, a carboxylic acid ion, a sulfonic acid ion, and a phenoxide ion.

In Formula (1), m represents an integer of 1 or more, and is preferably an integer of 1 to 10, more preferably an integer of 1 to 8, still more preferably an integer of 1 or 6, even more preferably an integer of 1 to 4, and particularly preferably 2.

In Formula (1), n represents an integer of 1 or more, and is preferably an integer of 1 to 10, more preferably an integer of 1 to 8, still more preferably an integer of 1 or 6, even more preferably an integer of 1 to 4, and particularly preferably 1.

Specific examples of the compound (1) include compounds having the following structures. In addition, for example, compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, paragraph "0082" of WO2017/038252A, and the like can also be used, the contents of which are incorporated herein by reference.

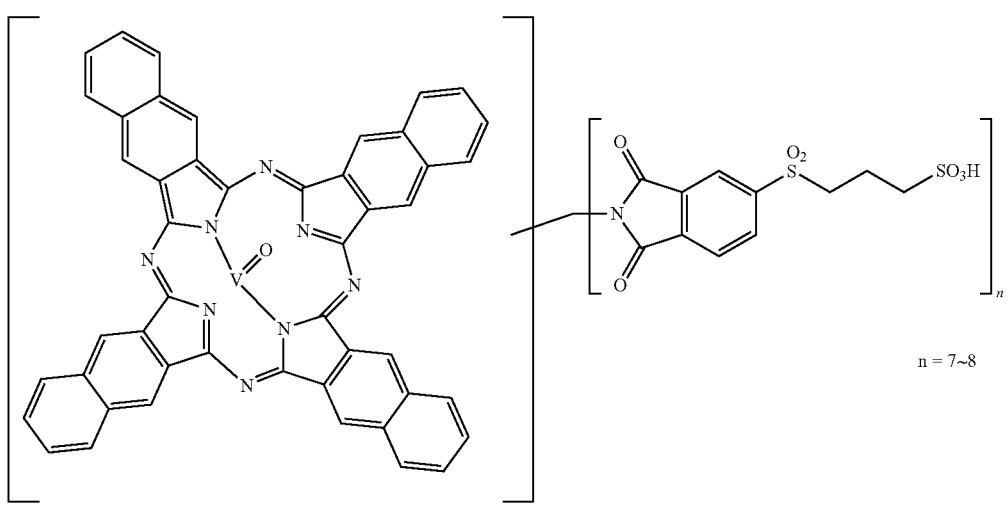

P1 n = 7~8

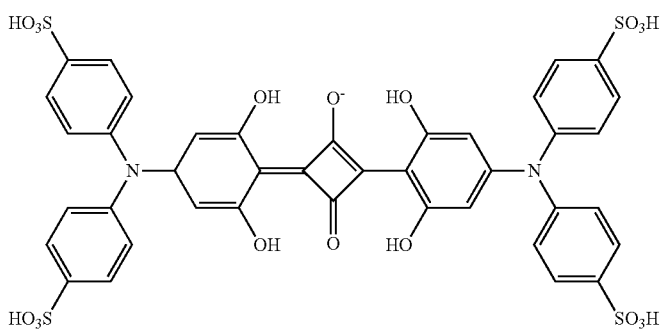

P2

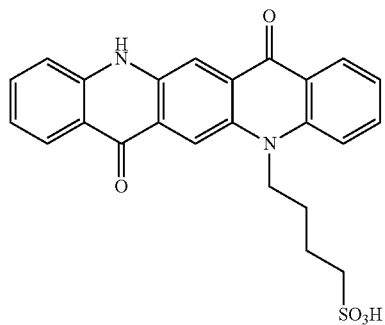
P3
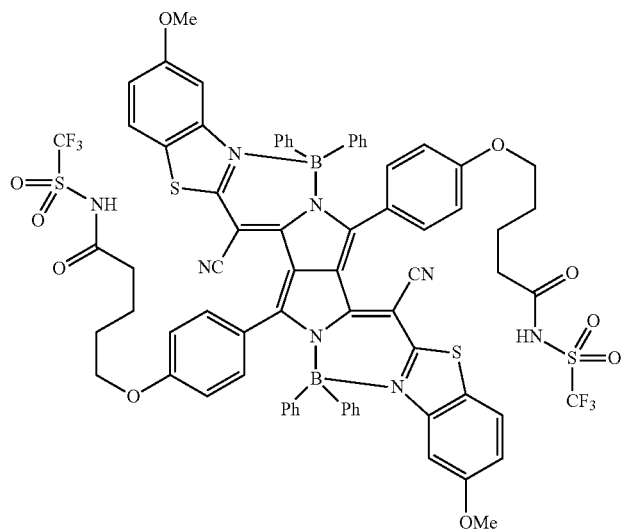
P4
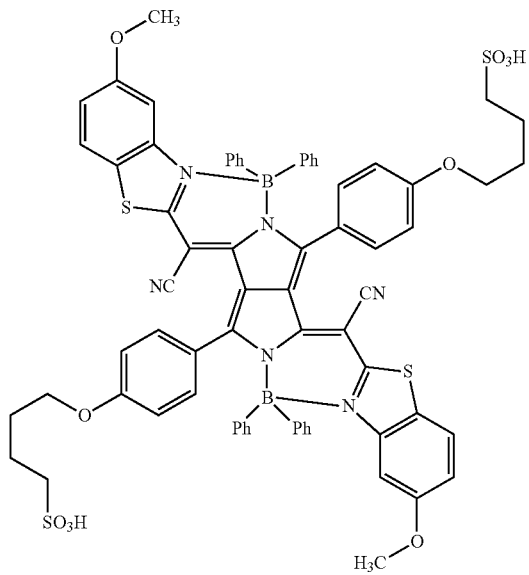
P5

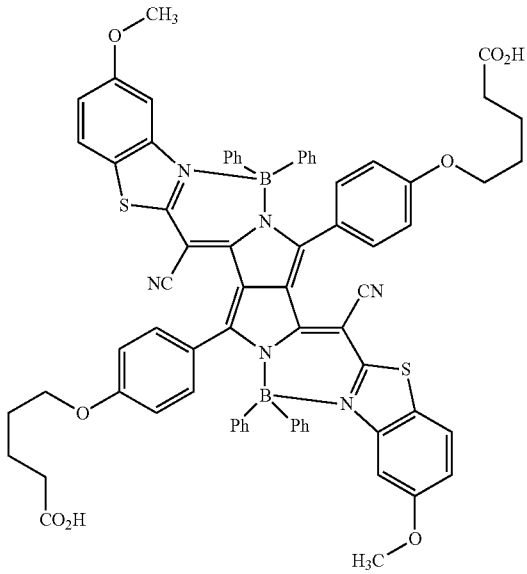

P6

The solubility of the compound (1) which is used in the composition according to the embodiment of the present invention in propylene glycol methyl ether acetate at 25° C. is 0.1 g/L or higher, preferably 0.5 g/L or higher and more preferably 1.0 g/L or higher. The upper limit is preferably 50 g/L or lower and more preferably 10 g/L or lower.

The content of the compound (1) in the total solid content of the composition is preferably 0.3 to 20 mass %. The lower limit is more preferably 0.6 mass % or higher and still more preferably 0.9 mass % or higher. The upper limit is more preferably 15 mass % or lower, still more preferably 12.5 mass % or lower, and even more preferably 10 mass % or lower.

In addition, the content of the compound (1) is preferably 1 to 30 parts by mass with respect to 100 parts by mass of the near infrared absorbing pigment. The lower limit is more preferably 2 parts by mass or higher and still more preferably 3 parts by mass or higher. The upper limit is more preferably 25 parts by mass or lower, still more preferably 20 parts by mass or lower, and even more preferably 15 parts by mass or lower. The compound (1) may be used singly or in combination of two or more kinds thereof. In a case where two or more thereof are used in combination, it is preferable that the total content thereof is within the above-described range.

<<Resin>>

The composition according to the embodiment of the present invention contains a resin. The resin is blended, for example, in order to disperse particles of the pigment and the like in the composition or to be blended as a binder. The resin which is mainly used to disperse particles of the pigment and the like will also be called a dispersant. However, the above-described uses of the resin are merely exemplary, and the resin can be used for purposes other than the uses.

The weight-average molecular weight (Mw) of the resin is preferably 3000 to 2000000. The upper limit is more preferably 1000000 or lower and still more preferably 500000 or lower. The lower limit is preferably 4000 or higher and more preferably 5000 or higher.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. Among these resins, one kind may be used alone, or a mixture of two or more kinds may be used. In addition, the resins described in paragraphs "0041" to "0060" of JP2017-206689A, and the resins described in paragraphs "0022" to "0071" of JP2018-010856A can also be used.

In the present invention, as the resin, a resin having an acid group can be preferably used. According to this aspect, developability of the composition can be improved, and pixels having excellent rectangularity can be easily formed. Examples of the acid group include a carboxyl group, a phosphate group, a sulfo group, and a phenolic hydroxyl group. Among these, a carboxyl group is preferable. The resin having an acid group can be used as, for example, an alkali-soluble resin.

The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is more preferably 50 mol % or lower and still more preferably 30 mol % or lower. The lower limit of the content of the repeating unit having an acid group in the side chain is more preferably 10 mol % or higher and still more preferably 20 mol % or higher.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

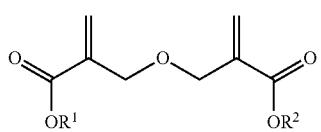

(ED1)

In Formula (ED1), $R^1$ and $R^2$ each independently represent a hydrogen atom or a hydrocarbon group having 1 to 25 carbon atoms which may have a substituent.

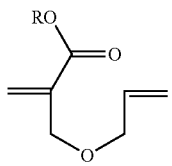

(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph "0317" of JP2013-029760A, the contents of which are incorporated herein by reference.

It is also preferable that the resin used in the present invention includes a repeating unit derived from a compound represented by Formula (X).

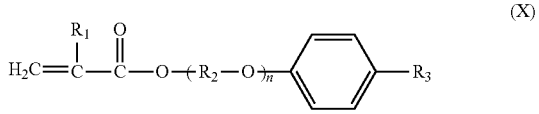

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product can also be used.

The acid value of the resin having an acid group is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 300 mgKOH/g or lower, and even more preferably 200 mgKOH/g or lower. The weight-average molecular weight (Mw) of the resin having an acid group is preferably 5000 to 100000. In addition, the number-average molecular weight (Mn) of the resin having an acid group is preferably 1000 to 20000.

Examples of the resin having an acid group include resins having the following structures.

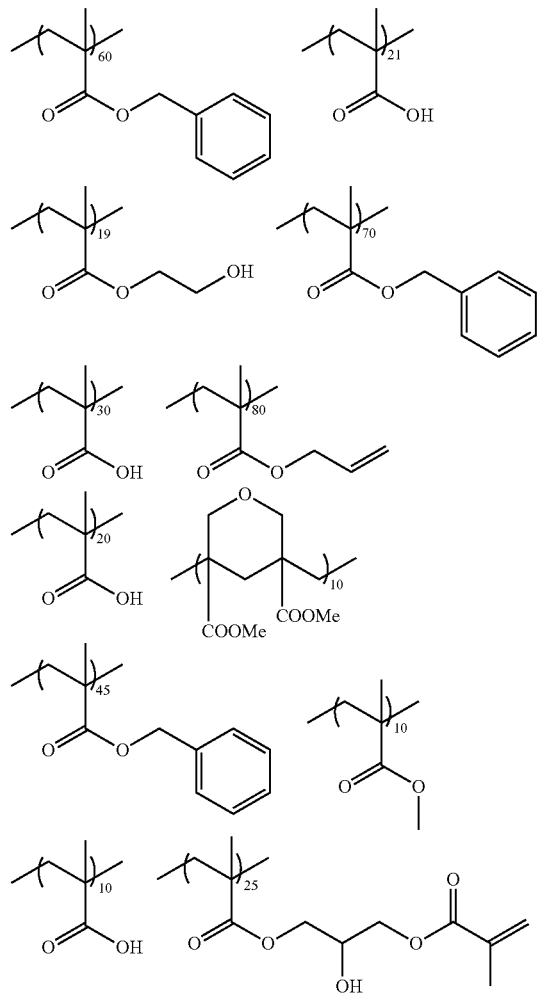

The composition according to the embodiment of the present invention preferably includes a resin as a dispersant. Examples of the dispersant include an acidic dispersant (acidic resin), a basic dispersant (basic resin), and an amphoteric dispersant (amphoteric resin). In the present invention, the acidic dispersant refers to a resin having an acid value of 5 mgKOH/g or higher and an amine value of lower than 5 mgKOH/g. It is preferable that the acidic dispersant does not have a basic group. The acid value of the acidic dispersant is preferably 5 to 200 mgKOH/g, more preferably 10 to 150 mgKOH/g, and still more preferably 30 to 150 mgKOH/g. In addition, in the present invention, the basic dispersant refers to a resin having an amine value of 5 mgKOH/g or higher and an acid value of lower than 5 mgKOH/g. It is preferable that the basic dispersant does not have an acid group. The amine value of the basic resin is preferably 5 to 200 mgKOH/g, more preferably 5 to 150 mgKOH/g, and still more preferably 5 to 100 mgKOH/g. In addition, in the present invention, the amphoteric dispersant refers to a resin which has an acid group and a basic group, and has an acid value of 5 mgKOH/g or higher and an amine value of 5 mgKOH/g or higher. The acid value of the amphoteric dispersant is preferably 5 to 200 mgKOH/g, more preferably 10 to 200 mgKOH/g, still more preferably 30 to 200 mgKOH/g, and particularly preferably 30 to 180 mgKOH/g. The amine value of the amphoteric dispersant is preferably 5 to 200 mgKOH/g, more preferably 10 to 150 mgKOH/g, and particularly preferably 10 to 130 mgKOH/g.

In the present invention, it is preferable that the compound having an acid group is used as the above-described compound (1), and the resin having a basic group, that is, the basic dispersant or the amphoteric dispersant is used as the dispersant. In particular, it is preferable to use the amphoteric dispersant. By using the basic dispersant or the amphoteric dispersant as the dispersant, interaction between the dispersant and the compound (1) works more strongly, the network of the near infrared absorbing pigment-compound (1)-dispersant is easily formed, and dispersibility of the near infrared absorbing pigment in the composition is further improved. In addition, aggregation of the compound (1) itself or aggregation of the near infrared absorbing pigment in the film can be suppressed, and it is also possible to produce a film in which the generation of aggregates derived from a compound having a colorant skeleton is further suppressed. In addition, in a case of using the amphoteric dispersant as the dispersant, in addition to the above-mentioned effects, the developability can be further improved.

It is preferable that the resin used as the dispersant is a graft resin. The details of the graft resin can be found in the description of paragraphs "0025" to "0094" of JP2012-255128A, the content of which is incorporated herein by reference.

It is also preferable that the resin used as the dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. The polyimine-based dispersant can be found in the description of paragraphs "0102" to "0166" of JP2012-255128A, the content of which is incorporated herein by reference.

It is also preferable that the resin used as the dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs "0196" to "0209" of JP2013-043962A.

In addition, the above-described resin (alkali-soluble resin) having an acid group can also be used as the dispersant.

In addition, it is also preferable that the resin used as the dispersant is a resin including a repeating unit having an ethylenically unsaturated bonding group in the side chain. The content of the repeating unit having an ethylenically unsaturated bonding group in the side chain is preferably 10 mol % or higher, more preferably 10 to 80 mol %, and still more preferably 20 to 70 mol % with respect to the total repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. In addition, a pigment dispersant described in paragraphs "0041" to "0130" of JP2014-130338A can also be used, the content of which is incorporated herein by reference. The resin described as the dispersant can be used for an application other than the dispersant. For example, the resin can also be used as a binder.

The content of the resin in the total solid content of the composition is preferably 5 to 50 mass %. The lower limit is more preferably 10 mass % or higher and still more preferably 15 mass % or higher. The upper limit is more preferably 40 mass % or lower, still more preferably 35 mass % or lower, and even more preferably 30 mass % or lower.

In addition, the content of the resin (alkali-soluble resin) having an acid group in the total solid content of the composition is preferably 5 to 50 mass %. The lower limit is more preferably 10 mass % or higher and still more preferably 15 mass % or higher. The upper limit is more preferably 40 mass % or lower, still more preferably 35 mass % or lower, and even more preferably 30 mass % or lower. In addition, from the reason that excellent developability is easily obtained, the content of the resin (alkali-soluble resin) having an acid group in the total amount of the resin is preferably 30 mass % or higher, more preferably 50 mass % or higher, still more preferably 70 mass % or higher, and particularly preferably 80 mass % or higher. The upper limit may be 100 mass %, 95 mass %, or 90 mass % or lower.

<<Amine Compound A>>

The composition according to the embodiment of the present invention contains a primary, secondary, or tertiary amine compound (hereinafter, also referred to as an amine compound A) having a molecular weight of 500 or less and a boiling point of 300° C. or lower. Here, the primary amine compound is a compound having a primary amino group in the molecule, the secondary amine compound is a compound having a secondary amino group in the molecule, and the tertiary amine compound is a compound having a tertiary amino group in the molecule.

Examples of the type of the amine compound A include an aliphatic amine compound, an aromatic amine compound, and a cyclic amine compound, and an aliphatic amine compound is preferable.

In addition, the amine compound A used in the present invention is preferably an alkylamine, more preferably a dialkylamine or a trialkylamine, and still more preferably a trialkylamine. In addition, the amine compound A used in the present invention is preferably a compound having one amino group in the molecule.

The molecular weight of the amine compound A used in the present invention is 500 or less, preferably 400 or less and more preferably 300 or less. In addition, the boiling point of the amine compound A is 300° C. or lower, preferably 250° C. or lower, still more preferably 200° C. or lower, even more preferably 180° C. or lower, still even more preferably 150° C. or lower, and particularly preferably 120° C. or lower, and most preferably 110° C. or lower. The lower limit is preferably 50° C. or higher.

It is also preferable that the amine compound A used in the present invention is a compound not including a silicon atom, an oxygen atom, and a sulfur atom.

The amine compound A used in the present invention is preferably a compound represented by $N(R_n^1)(R_n^2)(R_n^3)$. $R_n^1$ to $R_n^3$ each independently represent an alkyl group having 1 to 10 carbon atoms, and an alkyl group having 1 to 5 carbon atoms is preferable.

Specific examples of the primary amine compound include methylamine, ethylamine, propylamine, and butylamine. Specific examples of the secondary amine compound include dimethylamine, diethylamine, dipropylamine, dibutylamine, and cyclohexylamine. Specific examples of the tertiary amine compound include trimethylamine, triethylamine, tripropylamine, tributylamine, diethylmethylamine, dimethylethylamine, and pyridine.

The content of the amine compound A in the total solid content of the composition is 10 to 5000 mass ppm. The upper limit is preferably 3000 mass ppm or lower, more preferably 2000 mass ppm or lower, still more preferably 1000 mass ppm or lower, and particularly preferably 500 mass ppm or lower. The lower limit may be 50 mass ppm or higher, or 100 mass ppm or higher.

In addition, the content of the amine compound A is preferably 0.0001 to 0.5 parts by mass with respect to 100 parts by mass of the near infrared absorbing pigment. The upper limit is more preferably 0.2 parts by mass or lower, and still more preferably 0.1 parts by mass or lower. In addition, the content of the amine compound A is preferably 0.001 to 1 part by mass with respect to 100 parts by mass of the above-described compound (1). The upper limit is more preferably 0.5 parts by mass or lower, and still more preferably 0.2 parts by mass or lower. In addition, the content of the amine compound A is preferably 0.0001 to 0.1 parts by mass with respect to 100 parts by mass of the resin. The upper limit is more preferably 0.05 parts by mass or lower, and still more preferably 0.02 parts by mass or lower.

The content of the amine compound A in the total solid content of the composition can be quantified and determined by a gas chromatograph.

<<Solvent>>

The composition according to the embodiment of the present invention contains a solvent. As the solvent, an organic solvent is preferable. Examples of the organic solvent include an ester solvent, a ketone solvent, an alcohol solvent, an amide solvent, an ether solvent, and a hydrocarbon solvent. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, butanol, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In the composition according to the embodiment of the present invention, it is preferable that a solvent including at least one selected from propylene glycol monomethyl ether acetate and propylene glycol monomethyl ether is used as the solvent, and it is more preferable that a solvent including propylene glycol monomethyl ether acetate is used as the solvent.

In the present invention, an organic solvent having a low metal content is preferably used as the solvent. For example, the metal content in the organic solvent is preferably 10 mass ppb (parts per billion) or lower. Optionally, an organic solvent having a metal content at a mass parts per trillion (ppt) level may be used. For example, such an organic solvent is available from Toyo Gosei Co., Ltd. (The Chemical Daily, Nov. 13, 2015). Examples of a method of removing impurities such as metal from the organic solvent include distillation (for example, molecular distillation, thin-film distillation, and the like) and filtering using a filter. The pore size of a filter used for the filtering is preferably 10 μm or lower, more preferably 5 μm or lower, and still more preferably 3 μm or lower. As a material of the filter, polytetrafluoroethylene, polyethylene, or nylon is preferable.

The organic solvent may include an isomer (a compound having the same number of atoms and a different structure). In addition, the organic solvent may include only one isomer or a plurality of isomers.

In the present invention, an organic solvent containing 0.8 mmol/L or lower of a peroxide is preferable, and an organic solvent containing substantially no peroxide is more preferable.

The content of the solvent in the composition is preferably 10 to 95 mass %, more preferably 20 to 90 mass %, and still more preferably 30 to 90 mass %.

In addition, from the viewpoint of environmental regulation, it is preferable that the composition according to the embodiment of the present invention does not contain environmentally regulated substances substantially. In the present invention, the description "does not contain environmentally regulated substances substantially" means that the content of the environmentally regulated substances in the composition is 50 mass ppm or lower, preferably 30 mass ppm or lower, still more preferably 10 mass ppm or lower, and particularly preferably 1 mass ppm or lower. Examples of the environmentally regulated substances include benzene; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent at the time of producing respective components used in the composition according to the embodiment of the present invention, and may be incorporated into the composition as a residual solvent. From the viewpoint of human safety and environmental considerations, it is preferable to reduce these substances as much as preferable. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, composition produced by mixing these compounds, or the like.

<<Polymerizable Compound>>

It is preferable that the composition according to the embodiment of the present invention contains a polymerizable compound. As the polymerizable compound, a known compound which is cross-linkable by a radical, an acid, or heat can be used. In the present invention, the polymerizable compound is preferably, for example, a compound having an ethylenically unsaturated bonding group. Examples of the ethylenically unsaturated bonding group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the polymerizable compound is preferably a trifunctional to pentadecafunctional (meth)acrylate compound and more preferably a trifunctional to hexafunctional (meth)acrylate compound. Specific examples of the polymerizable compound include the compounds described in paragraphs "0095" to "0108" of JP2009-288705A, paragraph "0227" of JP2013-029760A, paragraphs "0254" to "0257" of JP2008-292970A, paragraphs "0034" to "0038" of JP2013-253224A, paragraph "0477" of JP2012-208494A, JP2017-048367A, JP6057891B, and JP6031807B, the contents of which are incorporated herein by reference.

The polymerizable compound is preferably a compound such as dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., NK ESTER A-DPH-12E, manufactured by Shin-Nakamura Chemical Co., Ltd.); and a compound having a structure in which the (meth)acryloyl group is bonded through an ethylene glycol and/or a propylene glycol residue (for example, SR454 and SR499 which are commercially available from Sartomer). In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3 LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in a non-exposed area is easily removed during development and the generation of development residues can be suppressed. Examples of the acid group include a carboxyl group, a sulfo group, and a phosphate group. Among these, a carboxyl group is preferable. Examples of a commercially available product of the polymerizable compound having an acid group include ARONIX M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, solubility in a developer is good, and in a case where the acid value of the polymerizable compound is 40 mgKOH/g or lower, it is advantageous in production and handling.

The polymerizable compound is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth)acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330, which is a trifunctional (meth)acrylate having three isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule described in JP1988-277653A (JP-S63-277653A), JP1988-260909A (JP-S63-260909A), or JP1989-105238A (JP-H01-105238A) are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOE-ISHA CHEMICAL Co., Ltd.) can also be used.

The content of the polymerizable compound in the total solid content of the composition is preferably 0.1 to 50 mass %. The lower limit is more preferably 0.5 mass % or higher and still more preferably 1 mass % or higher. The upper limit is more preferably 45 mass % or lower and still more preferably 40 mass % or lower. The polymerizable compound may be used singly or in combination of two or more kinds thereof. In a case where two or more thereof are used in combination, it is preferable that the total thereof is within the above-described range.

In addition, the total content of the polymerizable compound and the resin in the total solid content of the composition is preferably 10 to 65 mass %. The lower limit is more preferably 15 mass % or higher, still more preferably 20 mass % or higher, and even more preferably 30 mass % or higher. The upper limit is more preferably 60 mass % or lower, still more preferably 50 mass % or lower, and even more preferably 40 mass % or lower. In addition, the composition according to the embodiment of the present invention preferably contains 30 to 300 parts by mass of the resin with respect to 100 parts by mass of the polymerizable compound. The lower limit is more preferably 50 parts by mass or higher and still more preferably 80 parts by mass or higher. The upper limit is more preferably 250 parts by mass or lower and still more preferably 200 parts by mass or lower.

<<Photopolymerization Initiator>>

The composition according to the embodiment of the present invention preferably includes a photopolymerization initiator. In particular, in a case where the composition according to the embodiment of the present invention includes the polymerizable compound, it is preferable that the composition according to the embodiment of the present invention further includes a photopolymerization initiator. The photopolymerization initiator is not particularly limited and can be appropriately selected from known photopolymerization initiators. For example, a compound having photosensitivity to light in a range from an ultraviolet range to a visible range is preferable. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable. The details of the photopolymerization initiator can be found in paragraphs "0065" to "0111" of JP2014-130173A and JP6301489B, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraphs "0025" to "0038" of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of a commercially available product include IRGACURE-OXE01, IRGACURE-OXE02, IRGACURE-OXE03, and IRGACURE-OXE04 (all of which are manufactured by BASF SE), TR-PBG-304 (manufactured by TRONLY), and ADEKA OPTOMER N-1919 (manufactured by Adeka Corporation; photopolymerization initiator 2 described in JP2012-014052A). In addition, as the oxime compound, it is also preferable to use a compound having no colorability or a compound having high transparency and being difficult to discolor. Examples of a commercially available product include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content thereof is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The contents thereof are incorporated herein by reference.

In the present invention, an oxime compound having a nitro group can be used as the photopolymerization initiator. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by Adeka Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

(C-1)
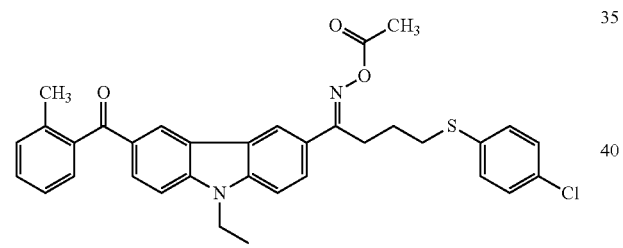

(C-2)
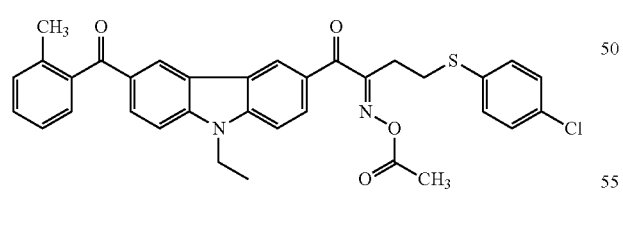

(C-3)
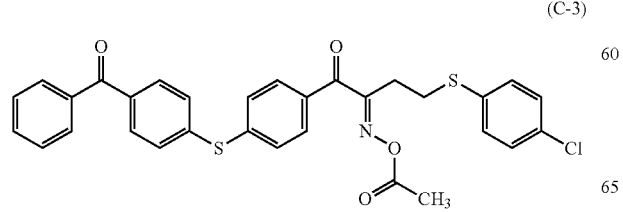

(C-4)
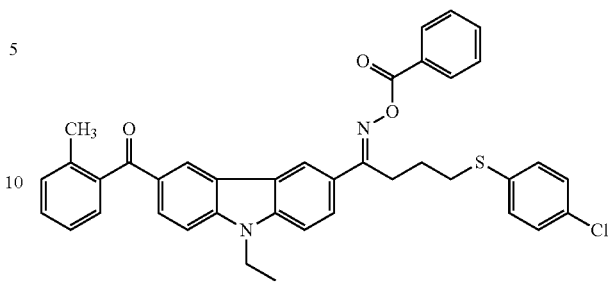

(C-5)
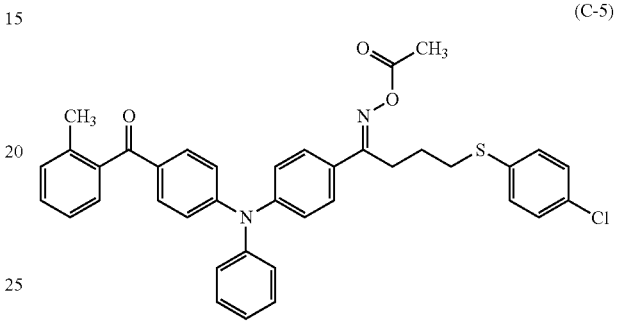

(C-6)
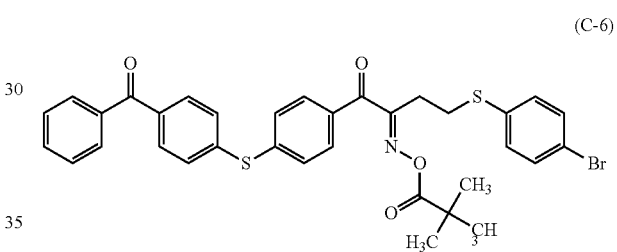

(C-7)
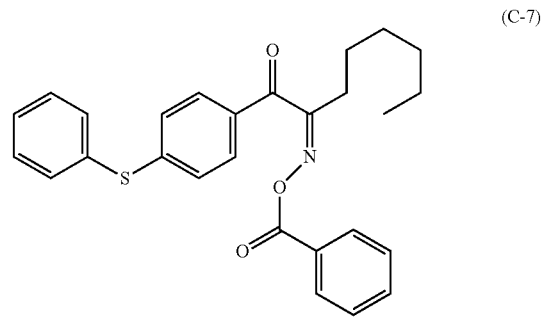

(C-8)
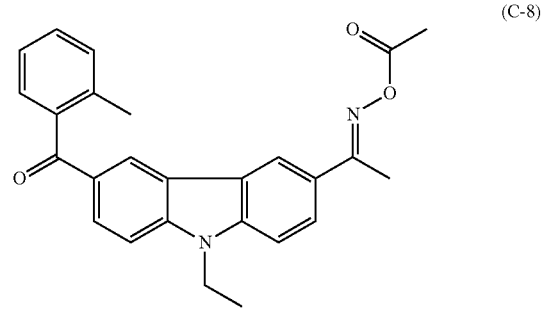

(C-9)
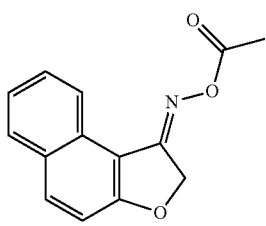

(C-14)
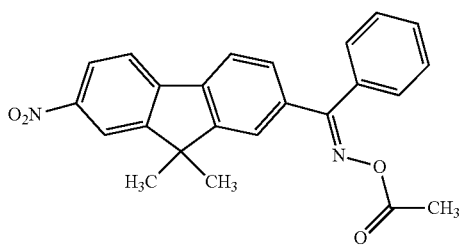

(C-10)
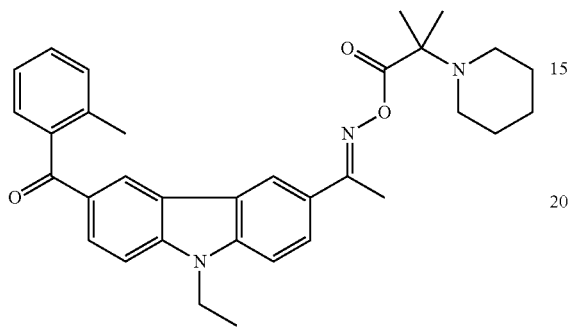

(C-15)
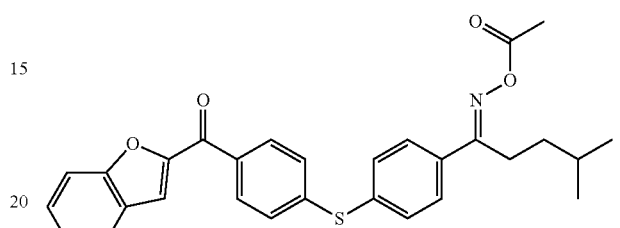

(C-11)
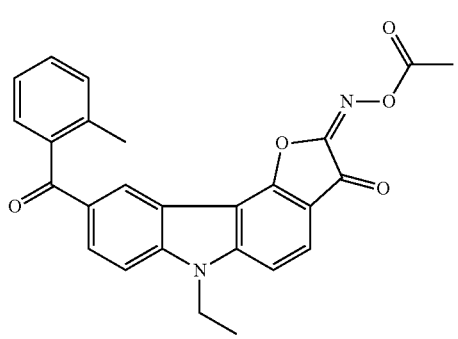

(C-16)
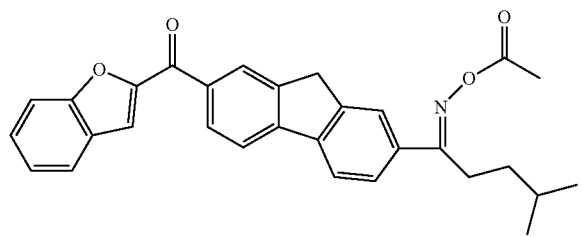

(C-12)
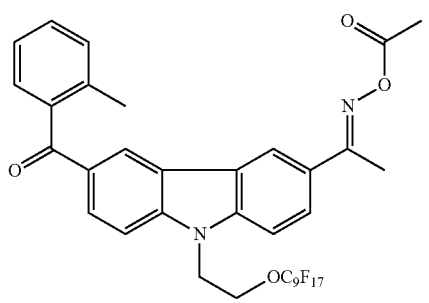

(C-13)
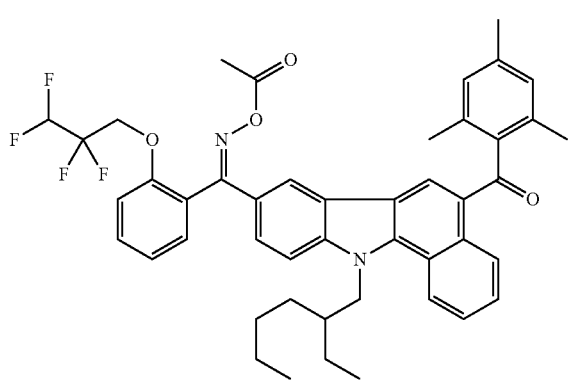

As the oxime compound, a compound having a maximum absorption wavelength in a range of 350 to 500 nm is preferable, and a compound having a maximum absorption wavelength in a range of 360 nm to 480 nm is more preferable. In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of: the compound can be measured using a known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, a bifunctional, or trifunctional or higher photoradical polymerization initiator may be used as the photopolymerization initiator. By using such a photoradical polymerization initiator, two or more radicals are generated from one molecule of the photoradical polymerization initiator, as a result, good sensitivity is obtained. In addition, in a case of using a compound having an asymmetric structure, crystallinity is reduced so that solubility in a solvent or the like is improved, precipitation becomes difficult over time, and temporal stability of the composition can be improved. Specific examples of the bifunctional or trifunctional or higher photoradical polymerization initiator include dimers of the oxime compounds described in JP2010-527339A, JP2011-524436A, WO2015/004565A, paragraphs "0407" to "0412" of JP2016-532675A, and paragraphs "0039" to "0055" of WO2017/033680A, the compound (E) and the compound (G) described in JP2013-522445A, Cmpd 1 to 7 described in WO2016/034963A, the oxime ester photoinitiators described in paragraph "0007" of JP2017-523465A, the photoinitiators described in paragraphs "0020" to "0033" of JP2017-167399A, and the photopolymerization initiator (A) described in paragraphs "0017" to "0026" of JP2017-151342A.

It is also preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

In a case where the composition according to the embodiment of the present invention contains a photopolymerization initiator, the content of the photopolymerization initiator in the total solid content of the composition according to the embodiment of the present invention is preferably 0.1 to 30 mass %. The lower limit is more preferably 0.5 mass % or higher and still more preferably 1 mass % or higher. The upper limit is more preferably 20 mass % or lower and still more preferably 15 mass % or lower. In the composition according to the embodiment of the present invention, as the photopolymerization initiator, one kind may be used alone, or two or more kinds may be used in combination. In a case where two or more thereof are used in combination, it is preferable that the total content thereof is within the above-described range.

<<Compound Having Cyclic Ether Group>>

The composition according to the embodiment of the present invention can contain a compound having a cyclic ether group. Examples of the cyclic ether group include an epoxy group and an oxetanyl group. The compound having a cyclic ether group is preferably a compound having an epoxy group. Examples of the compound having an epoxy group include a compound having one or more epoxy groups in one molecule, and a compound two or more epoxy groups in one molecule is preferable. It is preferable to have 1 to 100 epoxy groups in one molecule. The upper limit of the number of epoxy groups may be, for example, 10 or less or 5 or less. The lower limit of the epoxy group is more preferably 2 or more. As the compound having an epoxy group, the compounds described in paragraphs "0034" to "0036" of JP2013-011869A, paragraphs "0147" to "0156" of JP2014-043556A, and paragraphs "0085" to "0092" of JP2014-089408A, and the compounds described in JP2017-179172A can also be used. The contents thereof are incorporated herein by reference.

The compound having an epoxy group may be either a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the compound having an epoxy group is preferably 200 to 100000 and more preferably 500 to 50000. The upper limit of the weight-average molecular weight is more preferably 10000 or less, still more preferably 5000 or less, and even more preferably 3000 or less.

As the compound having an epoxy group, an epoxy resin can be preferably used. Examples of the epoxy resin include an epoxy resin which is a glycidyl etherified product of a phenol compound, an epoxy resin which is a glycidyl etherified product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq.

Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation., an epoxy group-containing polymer).

In a case where the composition according to the embodiment of the present invention contains a compound having a cyclic ether group, the content of the compound having a cyclic ether group in the total solid content of the composition is preferably 0.1 to 20 mass %. The lower limit is, for example, more preferably 0.5 mass % or higher and still more preferably 1 mass % or higher. The upper limit is, for example, more preferably 15 mass % or lower and still more preferably 10 mass % or lower. The compound having a cyclic ether group may be used singly or in combination of two or more kinds thereof. In a case where two or more kinds thereof are used in combination, it is preferable that the total content thereof is within the above-described range.

<<Chromatic Coloring Agent>>

The composition according to the embodiment of the present invention can contain a chromatic coloring agent. In the present invention, the chromatic coloring agent refers to a coloring agent other than a white coloring agent and a black coloring agent. Examples of the chromatic coloring agent include yellow coloring agents, orange coloring agents, red coloring agents, green coloring agents, violet coloring agents, and blue coloring agents. In the present invention, the chromatic coloring agent may be a pigment or a dye. As the pigment, an organic pigment is preferable. Examples of the organic pigment are as follows:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and 231 (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C. I. Pigment Green 7, 10, 36, 37, 58, 59, 62, and 63 (all of which are green pigments);

C. I. Pigment Violet 1, 19, 23, 27, 32, 37, and 42 (all of which are violet pigments); and C. I. Pigment Blue 1, 2, 15, 15:1, 15:2, 15:3, 15:4, 15:6, 16, 22, 60, 64, 66, 79, and 80 (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green coloring agent. Specific examples thereof include the compounds described in WO2015/118720A. In addition, a compound described in CN2010-6909027A, a phthalocyanine compound having phosphoric acid ester as a ligand, and the like can also be used as the green coloring agent.

In addition, an aluminum phthalocyanine compound having a phosphorus atom can also be used as the blue coloring agent. Specific examples thereof include the compounds described in paragraphs "0022" to "0030" of JP2012-247591A and paragraph "0047" of JP2011-157478A.

In addition, a pigment described in JP2017-201003A and a pigment described in JP2017-197719A can be used as the yellow coloring agent. In addition, as the yellow coloring agent, a metal azo pigment which includes at least one kind of an anion selected from an azo compound represented by Formula (I) or an azo compound having a tautomeric structure of the azo compound represented by Formula (I), two or more kinds of metal ions, and a melamine compound can be used.

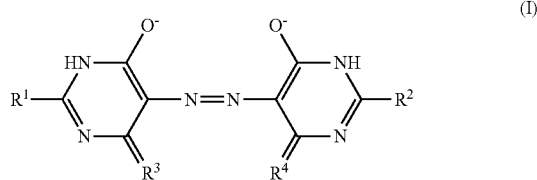

(I)

In the formula, $R^1$ and $R^2$ each independently represent —OH or —$NR^5R^6$, and $R^3$ and $R^4$ each independently represent =O or =$NR^7$, in which $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic, and is preferably linear or branched and particularly preferably linear. The alkyl group may have a substituent. The substituent is preferably a halogen atom, a hydroxyl group, an alkoxy group, a cyano group, or an amino group.

The details of the metal azo pigment can be found in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

In addition, as the yellow coloring agent, the quinophthalone compounds described in paragraphs "0011" to "0034" of JP2013-054339A, the quinophthalone compounds described in paragraphs "0013" to "0058" of JP2014-026228A, or the like can also be used. In addition, as the yellow coloring agent, the compounds described in JP2018-062644A can also be used. This compound can also be used as a pigment derivative.

A diketopyrrolopyrrole-based pigment described in JP2017-201384A, in which the structure has at least one substituted bromine atom, a diketopyrrolopyrrole-based pigment described in paragraphs "0016" to "0022" of JP6248838, and the like can also be used as the red coloring agent. In addition, as the red coloring agent, a compound having a structure that an aromatic ring group in which a group bonded with an oxygen atom, a sulfur atom, or a nitrogen atom is introduced to an aromatic ring is bonded to a diketopyrrolopyrrole skeleton can also be used.

As the dye, known dyes can be used without any particular limitation. Examples of thereof include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, a multimer of the above-described dyes may be used. In addition, dyes described in JP2015-028144A and JP2015-034966A can also be used.

In addition, as the chromatic coloring agent, the thiazole compound described in JP2012-158649A, the azo compound described in JP2011-184493A, or the azo compound described in JP2011-145540A can also be used.

In a case where the composition according to the embodiment of the present invention contains a chromatic coloring agent, the content of the chromatic coloring agent is preferably 0.1 to 70 mass % with respect to the total solid content of the composition according to the embodiment of the present invention. The lower limit is more preferably 0.5 mass % or higher and still more preferably 1.0 mass % or higher. The upper limit is more preferably 60 mass % or lower and still more preferably 50 mass % or lower. The content of the chromatic coloring agent is preferably 10 to 1000 parts by mass and more preferably 50 to 800 parts by mass with respect to 100 parts by mass of the near infrared absorbing pigment. In addition, the total content of the chromatic coloring agent and the near infrared absorbing pigment is preferably 1 to 80 mass % with respect to the total solid content of the composition according to the embodiment of the present invention. The lower limit is more preferably 5 mass % or higher and still more preferably 10 mass % or higher. The upper limit is more preferably 70 mass % or lower and still more preferably 60 mass % or lower. In a case where the composition according to the embodiment of the present invention includes two or more kinds of chromatic coloring agents, it is preferable that the total content of the two or more kinds thereof is within the above-described range.

<<Coloring Material which Allows Transmission of Infrared Light and Shields Visible Light>>

The composition according to the embodiment of the present invention may also contain a coloring material which allows transmission of infrared light and shields visible light (hereinafter, also referred to as "coloring material which shields visible light").

In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm.

In the present invention, it is preferable that the coloring material which shields visible light satisfies at least one of the following requirement (A) or (B).

(A): the coloring material which shields visible light includes two or more kinds of chromatic coloring agents, and a combination of the two or more kinds of chromatic coloring agents forms black.

(B): the coloring material which shields visible light includes an organic black coloring agent.

Examples of the chromatic coloring agent are as described above. Examples of the organic black coloring agent include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include compounds described in paragraphs "0016" to "0020" of JP2017-226821A, C. I. Pigment Black 31 and 32, and Lumogen Black FK4280. Examples of the azomethine compound include a compound described in JP1989-170601A (JP-H01-170601A) and JP1990-034664A (JP-H02-034664A). For example, "CHROMOFINE BLACK A1103" (manufactured by Dainichiseika Color & Chemicals Mfg. Co., Ltd.) is available.

In a case where a combination of two or more chromatic coloring agents forms black, examples of the combination of chromatic coloring agents are as follows.

(1) an aspect in which the coloring material which shields visible light includes a yellow coloring agent, a blue coloring agent, a violet coloring agent, and a red coloring agent (2) an aspect in which the coloring material which shields visible light includes a yellow coloring agent, a blue coloring agent, and a red coloring agent (3) an aspect in which the coloring material which shields visible light includes a yellow coloring agent, a violet coloring agent, and a red coloring agent (4) an aspect in which the coloring material which shields visible light includes a yellow coloring agent and a violet coloring agent (5) an aspect in which the coloring material which shields visible light includes a green coloring agent, a blue coloring agent, a violet coloring agent, and a red coloring agent (6) an aspect in which the coloring material which shields visible light includes a violet coloring agent and an orange coloring agent (7) an aspect in which the coloring material which shields visible light includes a green coloring agent, a violet coloring agent, and a red coloring agent (8) an aspect in which the coloring material which shields visible light includes a green coloring agent and a red coloring agent In a case where the composition according to the embodiment of the present invention contains the coloring material which shields visible light, the content, in the total solid content of the composition, of the coloring material which shields visible light is preferably 60 mass % or lower, more preferably 50 mass % or lower, still more preferably 30 mass % or lower, even more preferably 20 mass % or lower, and particularly preferably 15 mass % or lower. The lower limit may be, for example, 0.1 mass % or higher or 0.5 mass % or higher.

In addition, it is also preferable that the composition according to the embodiment of the present invention does not substantially contain the coloring material which shields visible light. Substantially not including the coloring material which shields visible light represents that the content, in the total solid content of the composition, of the coloring material which shields visible light is preferably 0.05 mass % or lower, more preferably 0.01 mass % or lower, and still more preferably 0 mass %.

<<Silane Coupling Agent>>

The composition according to the embodiment of the present invention can contain a silane coupling agent. According to this aspect, adhesiveness of a film to be obtained with a support can be further improved. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a (meta) allyl group, a (meth)acryloyl group, a mercapto group, an epoxy group, an oxetanyl group, an amino group, an ureido group, a sulfide group, an isocyanate group, and a phenyl group. Among these, an amino group, a (meth)acryloyl group, or an epoxy group is preferable. Specific examples of the silane coupling agent include a compound described in paragraphs "0018" to "0036" of JP2009-288703A and a compound described in paragraphs "0056" to "0066" of JP2009-242604A, the content of which is incorporated herein by reference.

The content of the silane coupling agent in the total solid content of the composition is preferably 0.01 to 5 mass %. The upper limit is more preferably 3 mass % or lower and still more preferably 2 mass % or lower. The lower limit is more preferably 0.5 mass % or higher and still more preferably 1 mass % or higher. As the silane coupling agent, one kind may be used alone, or two or more kinds may be used. In a case where two or more kinds thereof are used in combination, it is preferable that the total content thereof is within the above-described range.

<<Polymerization Inhibitor>>

The composition according to the embodiment of the present invention can contain a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor in the total solid content of the composition is preferably 0.0001 to 5 mass %.

<<Surfactant>>

The composition according to the embodiment of the present invention can contain a surfactant. As the surfactant, various surfactants such as a fluorine surfactant, a nonionic surfactant, a cationic surfactant, an anionic surfactant, or a silicon-based surfactant can be used. The details of the surfactant can be found in paragraphs "0238" to "0245" of WO2015/166779A, the content of which is incorporated herein by reference.

In the present invention, it is preferable that the surfactant is a fluorine surfactant. By containing a fluorine surfactant in the composition, liquid characteristics (particularly, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and particularly preferably 7 to 25 mass %. The fluorine surfactant in which the fluorine content is within the above-described range is effective from the viewpoints of the uniformity in the thickness of the coating film and liquid saving properties, and the solubility thereof in the composition is also excellent.

Examples of the fluorine surfactant include a surfactant described in paragraphs "0060" to "0064" of JP2014-041318A (corresponding to paragraphs "0060" to "0064" of WO2014/017669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be suitably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, the fluorine surfactant is also preferably a polymer of a fluorine atom-containing vinyl ether compound having a fluorinated alkyl group or a fluorinated alkylene ether group and a hydrophilic vinyl ether compound. The details of the fluorine surfactant can be found in the description of JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

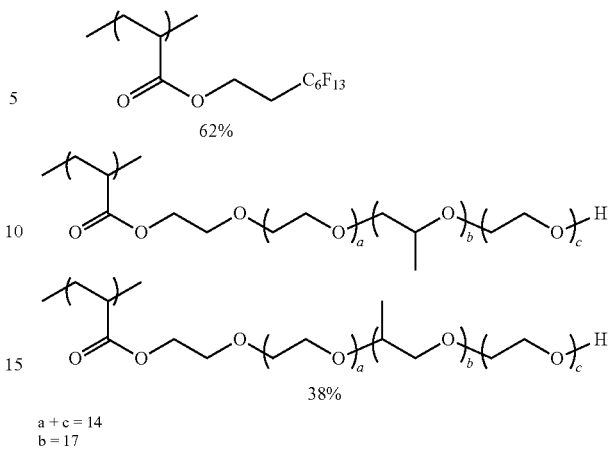

$a + c = 14$
$b = 17$

The weight-average molecular weight of the compound is preferably 3000 to 50000 and, for example, 14000. In the compound, "%" representing the proportion of a repeating unit is mol %.

In addition, as the fluorine surfactant, a fluorine-containing polymer having an ethylenically unsaturated bonding group at the side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R$^1$ (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the silicon-based surfactant include TORAY SILICONE DC3PA, TORAY SILICONE SH7PA, TORAY SILICONE DCl1PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Silicone Co., Ltd.), and BYK307, BYK323, and BYK330 (all of which are manufactured by BYK Chemie).

The content of the surfactant in the total solid content of the composition is preferably 0.001 mass % to 5.0 mass % and more preferably 0.005 to 3.0 mass %. As the surfactant, one kind may be used alone, or two or more kinds may be used. In a case where two or more kinds thereof are used in combination, it is preferable that the total content thereof is within the above-described range.

<<Ultraviolet Absorber>>

The composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, an hydroxyphenyltriazine compound, an indole compound, a triazine compound, or the like can be used. With regard to details thereof, reference can be made to the description in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series (manufactured by Miyoshi Oil&Fat Co., Ltd.; The Chemical Daily, Feb. 1, 2016). The content of the ultraviolet absorber in the total solid content of the composition is preferably 0.01 to 10 mass % and more preferably 0.01 to 5 mass %. In the present invention, as the ultraviolet absorber, one kind may be used alone, or two or more kinds may be used. In a case where two or more kinds thereof are used in combination, it is preferable that the total content thereof is within the above-described range.

<<Other Components>>

Optionally, the composition according to the embodiment of the present invention may contain a sensitizer, a curing accelerator, a filler, a thermal curing accelerator, thermal polymerization inhibitor, a plasticizer, and other auxiliary agents (for example, conductive particles, an antifoaming agent, a flame retardant, a leveling agent, a peeling accelerator, an antioxidant, a potential antioxidant, a flavoring agent, a surface tension adjuster, and a chain transfer agent). By appropriately containing these components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the content of which is incorporated herein by reference. As the antioxidant, for example, a phenol compound, a phosphorus-based compound (for example, the compounds described in paragraph "0042" of JP2011-090147A), a thioether compound, or the like can be used. Examples of a commercially available product thereof include ADK STAB series (AO-20, AO-30, AO-40, AO-50, AO-50F, AO-60, AO-60G, AO-80, AO-330, and the like) manufactured by ADEKA Corporation. The content of the antioxidant is preferably 0.01 to 20 mass % and more preferably 0.3 to 15 mass % with respect to the total solid content of the composition according to the embodiment of the present invention. As the antioxidant, one kind may be used alone, or two or more kinds may be used. In a case where two or more kinds thereof are used in combination, it is preferable that the total content thereof is within the above-described range. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or basic catalyst and the compound functions as an antioxidant. Examples of the potential antioxidant include the compounds described in WO2014/021023A, WO2017/030005A, and JP2017-008219A. Examples of a commercially available product include ADEKA ARKLS GPA-5001 (manufactured by Adeka Corporation). In addition, as the curing accelerator, compounds described in paragraphs "0085" to "0092" of JP5765059B can also be used.

In addition, in order to adjust the refractive index of the film to be obtained, the composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and most preferably 5 to 50 nm. The metal oxide may have a core-shell structure, and in this case, the core portion may be hollow.

In addition, the composition according to the embodiment of the present invention may include a light-resistance improver. Examples of the light-resistance improver include the compounds described in paragraphs "0036" and "0037" of JP2017-198787A, the compounds described in paragraphs "0029" to "0034" of JP2017-146350A, the compounds described in paragraphs "0036" and "0037", and "0049" to "0052" of JP2017-129774A, the compounds described in paragraphs "0031" to "0034", and "0058" and "0059" of JP2017-129674A, the compounds described in paragraphs "0036" and "0037", and "0051" to "0054" of JP2017-122803A, the compounds described in paragraphs "0025" to "0039" of WO2017/164127A, the compounds described in paragraphs "0034" to "0047" of JP2017-186546A, the compounds described in paragraphs "0019" to "0041" of JP2015-025116A, the compounds described in paragraphs "0101" to "0125" of JP2012-145604A, the compounds described in paragraphs "0018" to "0021" of JP2012-103475A, the compounds described in paragraphs "0015" to "0018" of JP2011-257591A, the compounds described in paragraphs "0017" to "0021" of JP2011-191483A, the compounds described in paragraphs "0108" to "0116" of JP2011-145668A, and the compounds described in paragraphs "0103" to "0153" of JP2011-253174A.

In the composition according to the embodiment of the present invention, the content of free metal which is not bonded to or coordinated with a pigment or the like is preferably 100 ppm or lower, more preferably 50 ppm or lower, and still more preferably 10 ppm or lower, and it is particularly preferable to not contain the free metal substantially. According to this aspect, stabilization of pigment dispersibility (restraint of aggregation), improvement of spectral characteristics due to improvement of dispersibility, stabilization of curable components, restraint of conductivity fluctuation due to elution of metal atoms and metal ions, improvement of display characteristics, and the like can be achieved. In addition, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described free metals include Na, K, Ca, Sc, Ti, Mn, Cu, Zn, Fe, Cr, Co, Mg, Al, Sn, Zr, Ga, Ge, Ag, Au, Pt, Cs, Ni, Cd, Pb, and Bi. In the composition according to the embodiment of the present invention, the content of free halogen which is not bonded to or coordinated with a pigment or the like is preferably 100 ppm or lower, more preferably 50 ppm or lower, and still more preferably 10 ppm or lower, and it is particularly preferable to not contain the free halogen substantially. Examples of a method for reducing free metals and halogens in the composition include washing with ion exchange water, filtration, ultrafiltration, and purification with an ion exchange resin.

It is preferable that the composition according to the embodiment of the present invention does not substantially include terephthalic acid ester.

For example, in a case where a film is formed by coating, the viscosity (25° C.) of the composition according to the embodiment of the present invention is preferably 1 to 100 mPa×s. The lower limit is more preferably 2 mPa×s or higher and still more preferably 3 mPa×s or higher. The upper limit is more preferably 50 mPa×s or lower, still more preferably 30 mPa×s or lower, and particularly preferably 15 mPa×s or lower.

The concentration of solid contents of the composition according to the embodiment of the present invention varies depending on the coating method and the like, but for example, is preferably 1 to 50 mass %. The lower limit is more preferably 10 mass % or higher. The upper limit is more preferably 30 mass % or lower.

A storage container of the composition according to the embodiment of the present invention is not particularly limited, and a known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the composition according to the embodiment of the present invention is not particularly limited. The composition according to the embodiment of the present invention can be preferably used as a composition for forming a near infrared cut filter or the like. In addition, by the composition according to the embodiment of the present invention further containing the coloring material which shields visible light, an infrared transmitting filter which can allow transmission of only near infrared light at a specific wavelength or higher can also be formed.

<Method for Preparing Composition>

The composition according to the embodiment of the present invention can be prepared by mixing the above-described components. In the preparation of the composition, all the components may be dissolved and/or dispersed in an organic solvent at the same time to prepare the composition. Optionally, two or more solutions or dispersion liquids to which the respective components are appropriately blended may be prepared, and the solutions or dispersion liquids may be mixed with each other during use (during application) to prepare the composition.

In addition, in the preparation of the composition, a process for dispersing the pigment is preferably included. Examples of a mechanical force used for dispersing the pigment in the process of dispersing the pigment include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the pigment using a sand mill (beads mill), it is preferable that the process is performed under conditions for increasing the pulverization efficiency, for example, by using beads having a small size and increasing the filling rate of the beads. In addition, it is preferable that rough particles are removed by filtering after crushing, centrifugal separation, and the like after pulverization treatment. In addition, as the process and the disperser for dispersing the pigment, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the pigment, particles may be refined in a salt milling step. A material, a device, process conditions, and the like used in the salt milling step can be found in, for example, JP2015-194521A and JP2012-046629A.

It is preferable that, in the preparation of the composition, the composition is filtered through a filter for the purpose of removing foreign matters, reducing defects, or the like. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is in the above-described range, fine foreign matter can be more reliably removed. With regard to the pore size value of the filter, reference can be made to a nominal value of filter manufacturers. As the filter, various filters provided by Nihon Pall Corporation (DFA4201NIEY and the like), Advantec Toyo Kaisha., Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHIPX type series (SHPX003 and the like), all manufactured by Roki Techno Co., Ltd.

In a case of using a filter, different filters (for example, a first filter and a second filter) may be combined. Here, the filtration with each of the filters may be performed once or may be performed twice or more times. In addition, filters having different pore sizes within the above-described range may be combined. In addition, the filtration through the first filter may be performed only a dispersion liquid, the other components may be mixed therewith, and then the filtration through the second filter may be performed.

<Film>

The film according to the embodiment of the present invention is a film obtained from the above-described composition according to the embodiment of the present invention. The film according to the embodiment of the present invention can be preferably used as various optical filters such as a near infrared cut filter and a near infrared transmitting filter. In particular, the film according to the embodiment of the present invention can be preferably used as a near infrared cut filter. The film according to the embodiment of the present invention may be a film having a pattern or a film (flat film) not having a pattern. In addition, the film according to the embodiment of the present invention may be used in a state where it is laminated on a support, or the film according to the embodiment of the present invention may be peeled off from a support.

In a case where the film according to the embodiment of the present invention is used as a near infrared transmitting filter, it is preferable that the composition according to the embodiment of the present invention further includes the coloring material which shields visible light.

The thickness of the film according to the embodiment of the present invention can be appropriately adjusted according to the purpose. The thickness of the film is preferably 20 μm or lower, more preferably 10 μm or lower, and still more preferably 5 μm or lower. For example, the lower limit of the thickness of the film is preferably 0.1 μm or higher, more preferably 0.2 μm or higher, and still more preferably 0.3 μm or higher.

In the present invention, the near infrared cut filter refers to a filter which allows transmission of light (visible light) in the visible range and shields at least a part of light (near infrared light) in the near infrared range. The near infrared cut filter may be a filter which allows transmission of light in the entire wavelength range of the visible range, or may be a filter which allows transmission of light in a specific wavelength range of the visible range and shields light in another specific wavelength range of the visible range. In addition, the near infrared transmitting filter refers to a filter which shields light in the visible range and allows transmission of at least a part of light (near infrared light) in the near infrared range.

In a case where the film according to the embodiment of the present invention is used as a near infrared cut filter, it is preferable that the film according to the embodiment of the present invention has a maximum absorption wavelength in a range of 650 to 1200 nm (preferably in a range of 700 to 1000 nm). The average transmittance in a wavelength range of 400 to 550 nm is preferably 70% or higher, more preferably 80% or higher, still more preferably 85% or higher, and particularly preferably 90% or higher. In addition, the transmittance of in the entire wavelength range of 400 to 550 nm is preferably 70% or higher, more preferably 80% or higher, and still more preferably 90% or higher. In addition, a preferred range of the near infrared shielding properties of the near infrared cut filter varies depending on the use. The transmittance at at least one point in a wavelength range of 650 to 1200 nm (preferably in a wavelength range of 700 to 1000 nm) is preferably 20% or lower, more preferably 15% or lower, and still more preferably 10% or lower.

In a case where the film according to the embodiment of the present invention is used as a near infrared cut filter, the film according to the embodiment of the present invention can also be used in combination with a color filter which includes a chromatic coloring agent. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid-state imaging element may be interposed between the film according to the embodiment of the present invention and the color filter.

In a case where the film according to the embodiment of the present invention is used as a near infrared transmitting filter, it is preferable that the film according to the embodiment of the present invention has, for example, any one of the following spectral characteristics (1) to (4).

(1): maximum value of the light transmittance of the film in a thickness direction in a wavelength range of 400 to 640 nm is 20% or lower (preferably 15% or lower and more preferably 10% or lower) and the minimum value of the light transmittance of the film in a thickness direction in a wavelength range of 800 to 1300 nm is 70% or higher (preferably 75% or higher and more preferably 80% or higher). This film can shield light having the wavelength range of 400 to 640 nm and can transmit light having a wavelength exceeding 670 nm.

(2): film in which the maximum value of the light transmittance of the film in a thickness direction in a wavelength range of 400 to 750 nm is 20% or lower (preferably 15% or lower and more preferably 10% or lower) and the minimum value of the light transmittance of the film in a thickness direction in a wavelength range of 900 to 1300 nm is 70% or higher (preferably 75% or higher and more preferably 80% or higher). This film can shield light having the wavelength range of 400 to 750 nm and can transmit light having a wavelength exceeding 850 nm.

(3): film in which the maximum value of the light transmittance of the film in a thickness direction in a wavelength range of 400 to 830 nm is 20% or lower (preferably 15% or lower and more preferably 10% or lower) and the minimum value of the light transmittance of the film in a thickness direction in a wavelength range of 1000 to 1300 nm is 70% or higher (preferably 75% or higher and more preferably 80% or higher). This film can shield light having the wavelength range of 400 to 830 nm and can transmit light having a wavelength exceeding 940 nm.

(4): film in which the maximum value of the light transmittance of the film in a thickness direction in a wavelength range of 400 to 950 nm is 20% or lower (preferably 15% or lower and more preferably 10% or lower) and the minimum value of the light transmittance of the film in a thickness direction in a wavelength range of 1100 to 1300 nm is 70% or higher (preferably 75% or higher and more preferably 80% or higher). This film can shield light having the wavelength range of 400 to 950 nm and can transmit light having a wavelength exceeding 1040 nm.

The film according to the embodiment of the present invention can be used in various devices including a solid-state imaging element such as a charge coupled device (CCD) or a complementary metal-oxide semiconductor (CMOS), an infrared sensor, or an image display device.

<Film Forming Method>

The film according to the embodiment of the present invention can be formed through a step of applying the composition according to the embodiment of the present invention. In the film forming method, it is preferable that the composition is applied to a support. Examples of the support include a substrate formed of a material such as silicon, non-alkali glass, soda glass, PYREX (registered trade name) glass, or quartz glass. For example, an organic film or an inorganic film may be formed on these substrates. Examples of a material of the organic film include the resins described above. In addition, as the support, a substrate formed of the resin can also be used. In addition, a charge coupled device (CCD), a complementary metal-oxide semiconductor (CMOS), a transparent conductive film, or the like may be formed on the support. In addition, a black matrix which isolates pixels from each other may be formed on the support. In addition, optionally, an undercoat layer may be provided on the support to improve adhesiveness with a layer above the semiconductor base material, to prevent diffusion of substances, or to make a surface of the substrate flat. In addition, in a case where a glass substrate is used as the support, it is preferable that an inorganic film is formed on the glass substrate or the glass substrate may be dealkalized to be used.

As a method of applying the composition, a known method can be used. Examples of the known method include: a drop casting method; a slit coating method; a spray method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet-Infinite Possibilities in Patent-" (February 2005, S.B. Research Co., Ltd.) and methods described in JP2003-262716A, JP2003-185831A, JP2003-261827A, JP2012-126830A, and JP2006-169325A. In addition, with regard to the method for applying the composition, reference can be made to the description in WO2017/030174A and WO2017/018419A, the contents of which are incorporated herein by reference.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, for example, even in a case where a photoelectric conversion film of an image sensor is formed of an organic material, characteristics of the organic material can be effectively maintained. The pre-baking time is preferably 10 seconds to 3000 seconds, more preferably 40 to 2500 seconds, and still more preferably 80 to 220 seconds. Drying can be performed using a hot plate, an oven, or the like.

The film forming method may further include a step of forming a pattern. Examples of the pattern forming method include a pattern forming method using a photolithography method and a pattern forming method using a dry etching method. In a case where the film according to the embodiment of the present invention is used as a flat film, the step of forming a pattern is not necessarily performed. Hereinafter, the step of forming a pattern will be described in detail. (Case where Pattern is Formed Using Photolithography Method)

It is preferable that the pattern forming method using a photolithography method includes: a step (exposure step) of exposing the composition layer, which is formed by applying the composition according to the embodiment of the present invention, in a pattern shape; and a step (development step) of forming a pattern by removing a non-exposed area of the composition layer by development. Optionally, the pattern forming method may further include a step (post-baking step) of baking the developed pattern. Hereinafter, the respective steps will be described.

In the exposure step, the composition layer is exposed in a pattern shape. For example, the composition layer can be subjected to patternwise exposure by performing exposure using a stepper exposure machine or a scanner exposure machine through a mask having a predetermined mask pattern. As a result, an exposed portion can be cured.

Examples of the radiation (light) which can be used during the exposure include g-rays and i-rays. In addition, light (preferably light having a wavelength of 180 to 300 nm) having a wavelength of 300 nm or lower can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or higher can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or lower, more preferably 50 nanoseconds or lower, and still more preferably 30 nanoseconds or lower. The lower limit of the pulse width is not particularly limited, and may be 1 femtosecond (fs) or higher or 10 femtoseconds or higher. The frequency is preferably 1 kHz or higher, more preferably 2 kHz or higher, and still more preferably 4 kHz or higher. The upper limit of the frequency is preferably 50 kHz or lower, more preferably 20 kHz or lower, and still more preferably 10 kHz or lower. The maximum instantaneous illuminance is preferably 50000000 W/m$^2$ or higher, more preferably 100000000 W/m$^2$ or higher, and still more preferably 200000000 W/m$^2$ or higher. In addition, the upper limit of the maximum instantaneous illuminance is preferably 1000000000 W/m$^2$ or lower, more preferably 800000000 W/m$^2$ or lower, and still more preferably 500000000 W/m$^2$ or lower. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is preferably 0.03 to 2.5 J/cm$^2$ and more preferably 0.05 to 1.0 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

Next, the non-exposed area of the composition layer is removed by development to form a pattern (pixel). The non-exposed area of the composition layer can be removed by development using a developer. As a result, the non-exposed area of the composition layer in the exposure step is eluted into the developer, and only the photocured portion remains. Examples of the developer include an organic solvent and an alkaline developer, and an organic alkaline developer is desirable. For example, the temperature of the developer is preferably 20° C. to 30° C. The development time is preferably 20 to 180 seconds. In addition, in order to improve residue removing properties, a step of shaking the developer off per 60 seconds and supplying a new developer may be repeated multiple times.

As the alkaline developer, an alkaline aqueous solution in which the alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl) ammonium hydroxide, choline, pyrrole, piperidine, or 1,8-diazabicyclo [5.4.0]-7-undecene; and an inorganic alkaline compound such as sodium hydroxide, potassium hydroxide, sodium carbonate, sodium bicarbonate, sodium silicate, or sodium metasilicate. In consideration of environmental aspects and safety aspects, the alkaline agent is preferably a compound having a high molecular weight. The concentration of the alkaline agent in the alkaline aqueous solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the composition layer after development while rotating the support on which the composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heat treatment (post-baking) after carrying out drying. The additional exposure treatment or post-baking is a curing treatment which is performed after development to complete the curing. The heating temperature in the post-baking is, for example, preferably 100° C. to 240° C. and more preferably 200° C. to 240° C. The film after the development is post-baked continuously or batchwise using heating unit such as a hot plate, a convection oven (hot air circulation dryer), and a high-frequency heater under the above-described conditions. In a case of carrying out the additional exposure treatment, light used for the exposure is preferably light having a wavelength of 400 nm or lower. In addition, the additional exposure treatment may be carried out by the method described in KR10-2017-122130A.

(Dry Etching Method)

The formation of a pattern using a dry etching method can be performed using a method including: a step of forming a composition layer on a support using the composition according to the embodiment of the present invention and curing the entire composition layer to form a cured composition layer; a step of forming a photoresist layer on this cured composition layer; a step of patternwise exposing the photoresist layer and then developing the photoresist layer to form a resist pattern; and a step of dry-etching the cured composition layer with an etching gas using this resist pattern as a mask. It is preferable that pre-baking is further performed in order to form the photoresist layer. In particular, as the forming process of the photoresist layer, it is desirable that a heat treatment after exposure and a heat treatment after development (post-baking treatment) are performed. The details of the pattern formation using the dry etching method can be found in paragraphs "0010" to "0067" of JP2013-064993A, the content of which is incorporated herein by reference.

<Optical Filter>

Next, an optical filter according to the embodiment of the present invention will be described. The optical filter according to the embodiment of the present invention includes the film according to the embodiment of the present invention. The optical filter according to the embodiment of the present invention can be preferably used as a near infrared cut filter or a near infrared transmitting filter, and more preferably used as a near infrared cut filter.

In a case where the film according to the embodiment of the present invention is used as a near infrared cut filter, the optical filter according to the embodiment of the present invention may further include a layer containing copper, a dielectric multi-layer film, or an ultraviolet absorbing layer in addition to the film according to the embodiment of the present invention. The details of the ultraviolet absorbing layer can be found in paragraphs "0040" to "0070" and paragraphs "0119" to "0145" of WO2015/099060A, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass include a phosphate glass containing copper and a fluorophosphate glass containing copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation). Examples of the copper complex include compounds described in paragraphs "0009" to "0049" of WO2016/068037A, the content of which is incorporated herein by reference.

In the optical filter according to the embodiment of the present invention, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near infrared rays, and the like) having a specific wavelength can be imparted. The thickness of the protective layer is preferably 0.01 to 10 μm and still more preferably 0.1 to 5 μm. Examples of a method for forming the protective layer include a method of forming the protective layer by applying a resin composition dissolved in an organic solvent, a chemical vapor deposition method, and a method of attaching a molded resin with an adhesive material. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluorine resin, a polycarbonate resin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an inkjet method can be used. As the organic solvent contained in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

Optionally, the protective layer may contain an additive such as organic or inorganic fine particles, an absorber of a specific wavelength (for example, ultraviolet rays, near infrared rays, and the like), a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. The content of these additives can be appropriately adjusted, but is preferably 0.1 to 70 mass % and still more preferably 1 to 60 mass % with respect to the total weight of the protective layer.

In addition, as the protective layer, the protective layers described in paragraphs "0073" to "0092" of JP2017-151176A can also be used.

In the optical filter according to the embodiment of the present invention, a near infrared cut filter and an infrared transmitting filter can be used in combination. By using a near infrared cut filter and an infrared transmitting filter in combination, this combination can be preferably used for an infrared sensor which detects infrared light at a specific wavelength. In a case where both a near infrared cut filter and an infrared transmitting filter are used in combination, either or both of the near infrared cut filter and the infrared transmitting filter can be formed using the composition according to the embodiment of the present invention.

<Solid-State Imaging Element>

A solid-state imaging element according to the embodiment of the present invention includes the film according to the embodiment of the present invention. The configuration of the solid-state imaging element is not particularly limited as long as it includes the film according to the embodiment of the present invention and functions as a solid-state imaging element. For example, the following configuration can be adopted.

The solid-state imaging element includes a plurality of photodiodes and transfer electrodes on the support, the photodiodes constituting a light receiving area of the solid-state imaging element, and the transfer electrode consisting of polysilicon or the like. In the solid-state imaging element, a light-shielding film consisting of tungsten or the like which has openings through only light receiving sections of the photodiodes is provided on the photodiodes and the transfer electrodes, a device protective film consisting of silicon nitride or the like is formed on the light-shielding film so as to cover the entire surface of the light-shielding film and the light receiving sections of the photodiodes, and the film according to the embodiment of the present invention is formed on the device protective film. Furthermore, a configuration in which light collecting unit (for example, a microlens; hereinafter, the same shall be applied) is provided above the device protective film and below the film according to the embodiment of the present invention (on a side thereof close the support), or a configuration in which light collecting unit is provided on the film according to the embodiment of the present invention may be adopted. In addition, the pixels of the color filter may be embedded in a space partitioned by a partition wall, for example, in a lattice form. Examples of an imaging device having such a structure include devices described in JP2012-227478A, JP2014-179577A, and WO2018/043654A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (written by Akiya Sasaki, Kogyo Chosakai Publishing Co., Ltd., published in 1990)" or "Display Device (written by Sumiaki Ibuki, Sangyo Tosho Co., Ltd., published in 1989). In addition, the details of a liquid crystal display device can be found in, for example, "Next-Generation Liquid Crystal Display Techniques (edited by Tatsuo Uchida, Kogyo Chosakai Publishing Co., Ltd., published in 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326 to 328 of "Forefront of Organic EL Technology Development- Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor according to the embodiment of the present invention will be described using the drawing.

In FIG. 1, reference numeral 110 represents a solid-state imaging element. In an imaging region provided on a solid-state imaging element 110, near infrared cut filters 111 and near infrared transmitting filters 114 are provided. In addition, color filters 112 are laminated on the near infrared cut filters 111. Microlenses 115 are disposed on an incidence ray hv side of the color filters 112 and the near infrared transmitting filters 114. A planarizing layer 116 is formed so as to cover the microlenses 115.

Spectral characteristics of the near infrared cut filters 111 can be selected according to the emission wavelength of an infrared light emitting diode (infrared LED) to be used. The near infrared cut filter 111 can be formed, for example, using the composition according to the embodiment of the present invention.

The color filter 112 is not particularly limited as long as pixels which allow transmission of light having a specific wavelength in a visible range and absorbs the light are formed therein. For example, pixels of red (R), green (G), and blue (B) are formed in the color filters. The details of the color filters can be found in paragraphs "0214" to "0263" of JP2014-043556A, the content of which is incorporated herein by reference.

Characteristics of the near infrared transmitting filter 114 can be selected according to the emission wavelength of the infrared LED to be used. For example, in a case where the emission wavelength of the infrared LED is 850 nm, it is preferable that, in the near infrared transmitting filter 114, the maximum value of a light transmittance of the film in a thickness direction in a wavelength range of 400 to 750 nm is 20% or lower (preferably 15% or lower and more preferably 10% or lower) and the minimum value of a light transmittance of the film in the thickness direction in a wavelength range of 900 to 1300 nm is 70% or higher (preferably 75% or higher and more preferably 80% or higher).

In addition, for example, in a case where the emission wavelength of the infrared LED is 940 nm, it is preferable that, in the near infrared transmitting filter 114, the maximum value of a light transmittance of the film in a thickness direction in a wavelength range of 400 to 830 nm is 20% or lower (preferably 15% or lower and more preferably 10% or lower) and the minimum value of a light transmittance of the film in the thickness direction in a wavelength range of 1000 to 1300 nm is 70% or higher (preferably 75% or higher and more preferably 80% or higher).

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. The details of the examples are as described above. In addition, as the other near infrared cut filter, a dual band pass filter may be used.

EXAMPLES

Hereinafter, the present invention will be described in detail using examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below.

<Measurement of Solubility of Near Infrared Absorbing Pigment and Compound (1)>

Under atmospheric pressure, 99 to 101 g of a sample (precisely weighed value is defined as X g) was added to 1 L of propylene glycol methyl ether acetate at 25° C., and the mixture was stirred for 30 minutes. Next, the mixture was allowed to stand for 5 minutes and filtered, and the filtrate was dried under reduced pressure at 80° C. for 2 hours and weighed precisely (precisely weighed value is defined as Y g). Solubility of the sample dissolved in propylene glycol methyl ether acetate was calculated from the following expression.

$$\text{Solubility (g/L)} = X - Y$$

<Method for Quantifying Amine Compound in Composition>

The amount of the amine compound in the composition was quantified by a gas chromatograph (7890A, manufactured by Agilent Technologies, Inc). Specifically, the composition was filtered through a 0.5 μm polytetrafluoroethylene (PTFE) filter, and the amount of the amine compound in the composition was quantified using the passing liquid as a specimen of the gas chromatograph and using DB-WAXETR (column length: 30 m, inner diameter: 0.25 mm, film thickness: 0.25 μm; manufactured by Agilent J&W (122-7332)) as a column.

<Production of Dispersion Liquid>

10 parts by mass of the near infrared absorbing pigment shown in the following table, 3 parts by mass of the compound (1) shown in the following table, 150 parts by mass of the solvent shown in the following table, 7.8 parts by mass of the resin shown in the following table, and 230 parts by mass of zirconia beads having a diameter of 0.3 mm were mixed with each other, the mixture was dispersed using a paint shaker for 5 hours, and the beads were separated by filtration, thereby producing a dispersion liquid. Regarding the dispersion liquid 12, 5 parts by mass of the near infrared absorbing pigment A1 and 5 parts by mass of the near infrared absorbing pigment A2 were used. In addition, regarding the dispersion liquid 13, 75 parts by mass of the solvent C-1 and 75 parts by mass of the solvent C-2 were used. In addition, regarding the dispersion liquid 14, 3.9 parts by mass of the resin D-1 and 3.9 parts by mass of the resin D-2 were used.

TABLE 1

|  | Near infrared absorbing pigment | Compound (1) | Solvent | Resin |
|---|---|---|---|---|
| Dispersion liquid 1 | A1 | P1 | C-1 | D-1 |
| Dispersion liquid 2 | A1 | P2 | C-1 | D-1 |
| Dispersion liquid 3 | A1 | P3 | C-1 | D-1 |

TABLE 1-continued

| | Near infrared absorbing pigment | Compound (1) | Solvent | Resin |
|---|---|---|---|---|
| Dispersion liquid 4 | A1 | P4 | C-1 | D-1 |
| Dispersion liquid 5 | A1 | P4 | C-1 | D-1 |
| Dispersion liquid 6 | A1 | P5 | C-1 | D-1 |
| Dispersion liquid 7 | A1 | P5 | C-1 | D-1 |
| Dispersion liquid 8 | A1 | P4 | C-1 | D-1 |
| Dispersion liquid 9 | A1 | P6 | C-1 | D-1 |
| Dispersion liquid 10 | A1 | P4 | C-1 | D-2 |
| Dispersion liquid 11 | A1 | P5 | C-1 | D-3 |
| Dispersion liquid 12 | A1 + A2 | P4 | C-1 | D-1 |
| Dispersion liquid 13 | A1 | P4 | C-1 + C-2 | D-1 |
| Dispersion liquid 14 | A1 | P4 | C-1 | D-1 + D-2 |
| Dispersion liquid 15 | A1 | P4 | C-1 | D-1 |
| Dispersion liquid 16 | A1 | P4 | C-1 | D-1 |
| Dispersion liquid 17 | A1 | P4 | C-1 | D-1 |
| Dispersion liquid 18 | A3 | P2 | C-1 | D-1 |
| Dispersion liquid 19 | A4 | P1 | C-1 | D-1 |
| Dispersion liquid R1 | A1 | — | C-1 | D-1 |
| Dispersion liquid R2 | A1 | P4 | C-1 | D-1 |
| Dispersion liquid R3 | A1 | P5 | C-1 | D-1 |

The raw materials described in the above table are as follows.

(Near Infrared Absorbing Pigment)

A1: compound having the following structure (solubility in propylene glycol methyl ether acetate at 25° is lower than 0.1 g/L)

A2: compound having the following structure (solubility in propylene glycol methyl ether acetate at 25° is lower than 0.1 g/L)

A3: compound having the following structure (solubility in propylene glycol methyl ether acetate at 25° is lower than 0.1 g/L)

A4: compound having the following structure (solubility in propylene glycol methyl ether acetate at 25° is lower than 0.1 g/L)

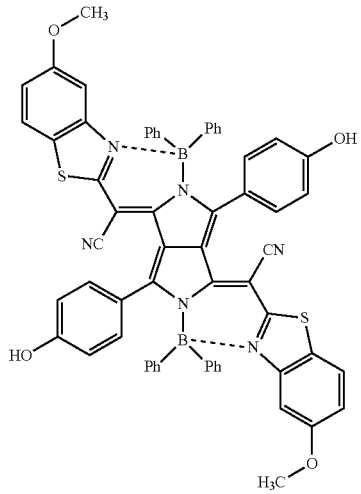

A1

A2

A3

A4

Compound (1)

P1 to P6: compounds having the following structures; P1, P3, P4, and P5 have a solubility in propylene glycol methyl ether acetate at 25° C. of 0.5 g/L or higher; P2 and P6 have a solubility in propylene glycol methyl ether acetate at 25° C. of 0.1 g/L or higher and lower than 0.5 g/L.

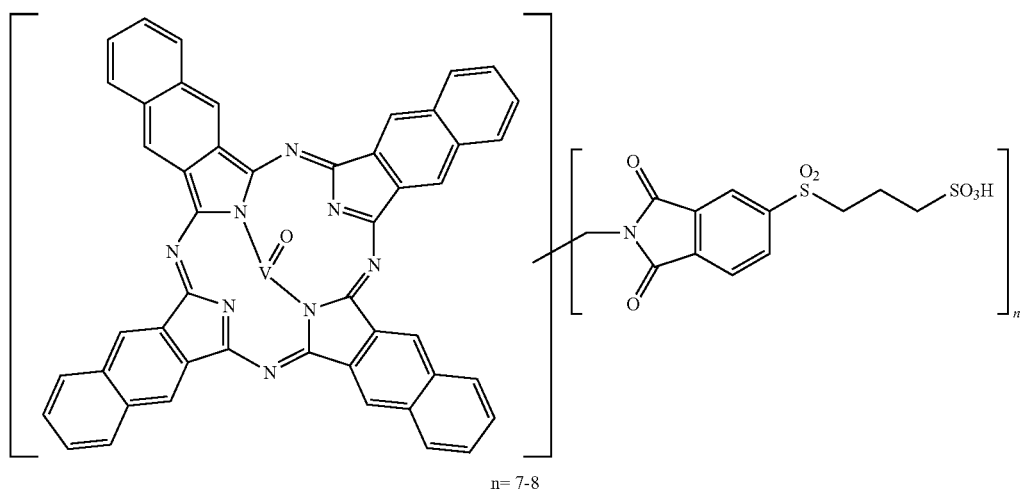
P1
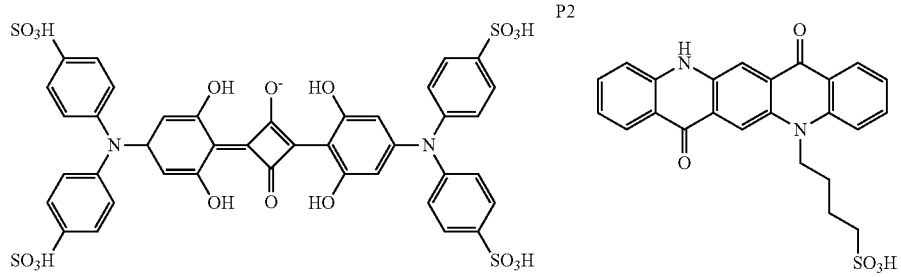
P2
P3
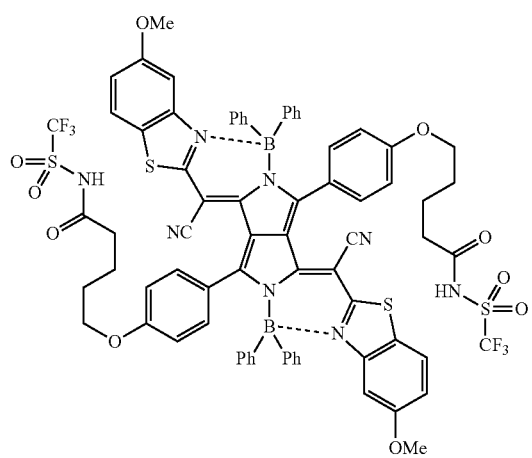
P4
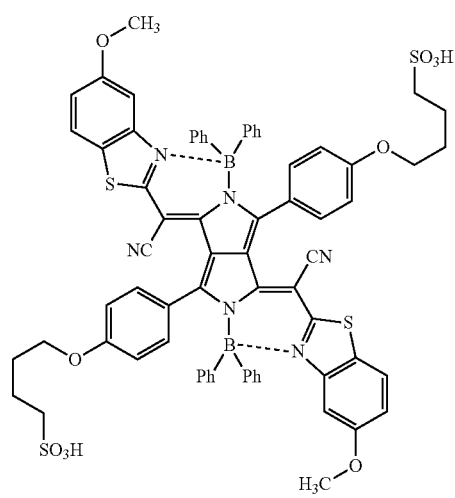
P5

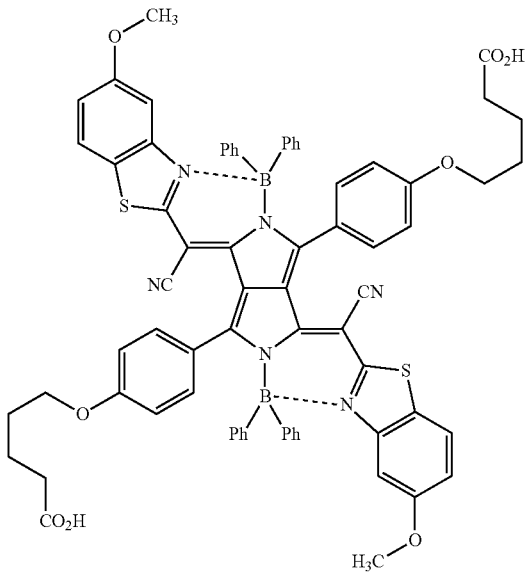

P6

(Solvent)

C-1: propylene glycol monomethyl ether acetate (PGMEA)

C-2: butanol (Resin)

D-1: resin having the following structure (a numerical value added to a main chain represents a molar ratio, and a numerical value added to a side chain represents the number of repeating units; acid value=36.0 mgKOH/g, amine value=47.0 mgKOH/g, weight-average molecular weight=20903)

D-2: resin having the following structure (a numerical value added to a main chain represents a mass ratio; weight-average molecular weight=17000)

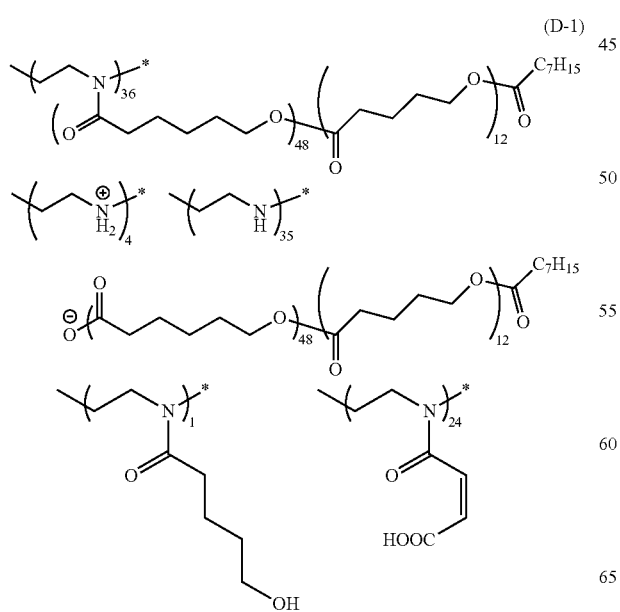

(D-1)

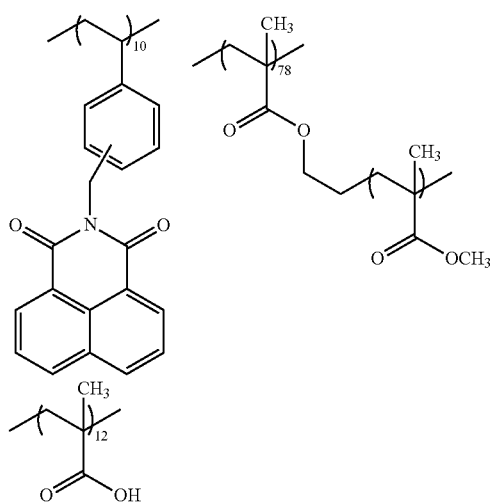

(D-2)

<Production of Composition>

A composition was produced by mixing the following components with the amine compound shown in the table below. The amine compound was added to the composition while being quantified by a gas chromatograph, thereby adjusting the content of the amine compound in the composition so as to be the content shown in the table below. The numerical value of the content of the amine compound shown in the table below is a value of the content of the amine compound in the total solid content of the composition.

Dispersion liquid shown in the table below: 55 parts by mass

Alkali-soluble resin (ACRYBASE FF-426, manufactured by NIPPON SHOKUBAI CO., LTD.): 7.0 parts by mass Polymerizable compound (ARONIX M-305, a mixture of pentaerythritol triacrylate and pentaerythritol tetraacrylate, containing 55 to 63 mass % of pentaerythritol triacrylate, manufactured by TOAGOSEI CO., LTD.): 4.5 parts by mass Photoradical polymerization initiator (IRGACURE-OXE02, manufactured by BASF SE): 0.8 parts by mass Polymerization inhibitor (paramethoxyphenol): 0.001 parts by mass Surfactant (following mixture (Mw=14000); in the formula, "%" representing the proportion of a repeating unit is mol %): 0.03 parts by mass

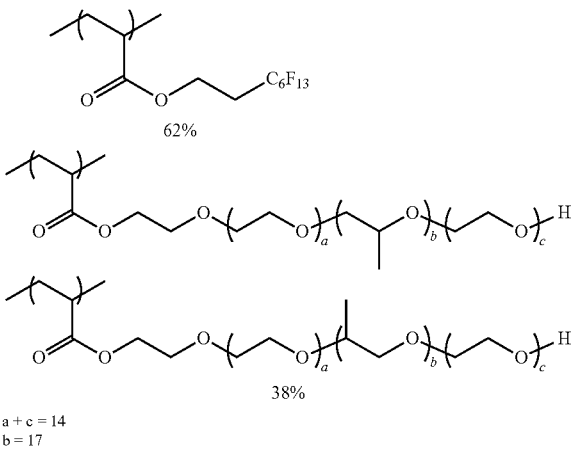

$a + c = 14$
$b = 17$

Ultraviolet absorber (UV-503, manufactured by Daito Chemical Co., Ltd.): 1.3 parts by mass Solvent (propylene glycol monomethyl ether acetate): 31 parts by mass (Amine Compound)

Am-1: triethylamine (molecular weight: 101, boiling point: 90° C., tertiary amine compound)

Am-2: pyridine (molecular weight: 79, boiling point: 115° C., tertiary amine compound)

Am-3: butylamine (molecular weight: 73, boiling point: 78° C., primary amine compound)

Am-4: diisopropylamine (molecular weight: 101, boiling point: 84° C., secondary amine compound)

Evaluation

Each composition was placed in an airtight container and stored at a temperature of 50° C. for 3 days. The composition after storage was applied onto a glass substrate by a spin coating method, and then heated at 100° C. for 2 minutes using a hot plate to obtain a composition layer. Using an i-ray stepper, the obtained composition layer was exposed to an exposure dose of 500 mJ/cm$^2$. Next, the coated layer after exposure was further cured at 220° C. for 5 minutes using a hot plate to obtain a film having a thickness of 0.7 μm. The obtained film was observed with an optical microscope, and the number of foreign matter defects generated within an area of 100 μm×100 μm was counted. There are two types of foreign matter defects, and elongated defects are classified as a defect type 1 and granular defects are classified as a defect type 2. Here, a defect having a length ratio of a major axis to a minor axis (major axis/minor axis) of 3 or more is the defect type 1, and a defect having a length ratio of a major axis to a minor axis (major axis/minor axis) of less than 3 is the defect type 2.

(Evaluation Standard for Defect Type 1)
A: number of defects is less than 10.
B: number of defects is 10 or more and less than 30.
C: number of defects is 30 or more.

(Evaluation Standard for Defect Type 2)
A: number of defects is less than 10.
B: number of defects is 10 or more and less than 30.
C: number of defects is 30 or more.

TABLE 2

| | | Amine compound | | | |
|---|---|---|---|---|---|
| | Type of dispersion liquid | Type | Content (mass ppm) | Defect type 1 | Defect type 2 |
| Example 1 | Dispersion liquid 1 | Am-1 | 100 | A | A |
| Example 2 | Dispersion liquid 2 | Am-1 | 100 | B | A |
| Example 3 | Dispersion liquid 3 | Am-1 | 100 | A | A |
| Example 4 | Dispersion liquid 4 | Am-1 | 2000 | A | A |
| Example 5 | Dispersion liquid 5 | Am-1 | 100 | A | A |
| Example 6 | Dispersion liquid 6 | Am-1 | 2000 | A | A |
| Example 7 | Dispersion liquid 7 | Am-1 | 100 | A | A |
| Example 8 | Dispersion liquid 8 | Am-2 | 100 | B | A |
| Example 9 | Dispersion liquid 9 | Am-1 | 100 | B | A |
| Example 10 | Dispersion liquid 10 | Am-1 | 100 | A | A |
| Example 11 | Dispersion liquid 11 | Am-1 | 2000 | A | A |
| Example 12 | Dispersion liquid 12 | Am-1 | 100 | A | A |
| Example 13 | Dispersion liquid 13 | Am-1 | 100 | A | A |
| Example 14 | Dispersion liquid 14 | Am-1 | 100 | A | A |
| Example 15 | Dispersion liquid 15 | Am-3 | 100 | B | A |
| Example 16 | Dispersion liquid 16 | Am-4 | 100 | B | A |
| Example 17 | Dispersion liquid 17 | Am-1 | 100 | A | B |
| Example 18 | Dispersion liquid 18 | Am-1 | 100 | B | A |
| Example 19 | Dispersion liquid 19 | Am-1 | 100 | B | A |
| Comparative Example 1 | Dispersion liquid R1 | Am-1 | 100 | B | C |
| Comparative Example 2 | Dispersion liquid R2 | Am-1 | 6000 | C | A |
| Comparative Example 3 | Dispersion liquid R3 | Am-1 | 6000 | C | C |

As shown in the above table, the examples were able to suppress the occurrence of defects.

In each example, even in a case where, as the polymerizable compound, ARONIX M-510 (manufactured by TOAGOSEI CO., LTD.), KAYARAD DPHA (manufactured by Nippon Kayaku Co., Ltd.), or ARTON F4520 (manufactured by JSR Corporation) was used instead of ARONIX M-305 (manufactured by TOAGOSEI CO., LTD.), the same effects were obtained.

In each example, even in a case where, as the polymerizable compound, a mixture in which KAYARAD DPHA (manufactured by Nippon Kayaku Co., Ltd.) and NK ESTER A-DPH-12E (manufactured by Shin-Nakamura Chemical Co., Ltd.) were used in combination at a mass ratio of 1:1, a mixture in which NK ESTER A-TMMT (manufactured by Shin-Nakamura Chemical Co., Ltd.) and NK ESTER A-DPH-12E (manufactured by Shin-Nakamura Chemical Co., Ltd.) were used in combination at a mass ratio of 1:1, or a mixture in which ARONIX TO-2349 (manufactured by TOAGOSEI CO., LTD.) and NK ESTER A-DPH-12E (manufactured by Shin-Nakamura Chemical Co., Ltd.) were used in combination at a mass ratio of 1:1 was used instead of ARONIX M-305 (manufactured by TOAGOSEI CO., LTD.), the same effects were obtained.

In each example, in a case where, as the alkali-soluble resin, instead of ACRYBASE FF-426 (manufactured by NIPPON SHOKUBAI CO., LTD.), ARCYCURE RD-F8 (manufactured by NIPPON SHOKUBAI CO., LTD.), ACRYBASE FFS-6752 (manufactured by NIPPON SHOKUBAI CO., LTD.), or a mixture in which two of these were used in combination at a mass ratio of 1:1 was used, the same effects were obtained.

In each example, even in a case where, as the photoradical polymerization initiator, instead of IRGACURE-OXE02 (manufactured by BASF SE), IRGACURE-184, DARO-CUR-1173, IRGACURE-500, IRGACURE-2959, IRGACURE-127, IRGACURE-907, IRGACURE-369, IRGACURE-379, IRGACURE-379EG, IRGACURE-819 (all of which are manufactured by BASF SE), or a mixture in which two of these were used in combination at a mass ratio of 1:1 was used, the same effects were obtained.

In each example, even in a case where two kinds of the compounds (1) were used in combination, the same effects as in each example were obtained.

In Example 1, even in a case where the amine compound Am-2 was further contained in an amount of 100 mass ppm, the same effects as in Example 1 were obtained.

Example 101

The composition of Example 1 was applied onto a silicon wafer using a spin coating method such that the thickness of the formed film was 1.0 μm, and the composition was heated using a hot plate at 100° C. for 2 minutes and further heated using the hot plate at 200° C. for 5 minutes to form a near infrared cut filter.

Next, a Green composition 1 was applied onto the near infrared cut filter using a spin coating method such that the thickness of the film after post-baking was 1.0 μm. Next, the coating film was heated using a hot plate at 100° C. for 2 minutes. Next, using an i-ray stepper exposure device FPA-3000 i5+ (manufactured by Canon Corporation), the coating film was exposed with light having a wavelength of 365 nm at an exposure dose of 1000 mJ/cm$^2$ through a mask having a 2 μm×2 μm dot pattern. Next, puddle development was performed at 23° C. for 60 seconds using a tetramethylammonium hydroxide (TMAH) 0.3 mass % aqueous solution. Next, the coating film was rinsed by spin showering and cleaned with pure water. Next, the Green composition 1 was patterned by heating (post-baking) at 200° C. for 5 minutes using a hot plate. Likewise, a Red composition 1 and a Blue composition 1 were sequentially patterned to form green, red, and blue colored patterns (Bayer pattern).

The Green composition 1, Red composition 1, and Blue composition 1 will be described later.

The Bayer pattern refers to a pattern, as disclosed in the specification of U.S. Pat. No. 3,971,065A, in which a 2×2 array of color filter element having one Red element, two Green elements, and one Blue element is repeated.

The obtained color filter was incorporated into a solid-state imaging element according to a known method. The solid-state imaging element had a suitable image recognition ability.

(Green Composition 1)

The following components were mixed and stirred, and the obtained mixture was filtered through a nylon filter (manufactured by Nihon Pall Corporation) having a pore size of 0.45 μm to prepare a Green composition 1.

Green pigment dispersion liquid . . . 73.7 parts by mass
40% PGMEA solution of the resin 101 . . . 0.3 parts by mass
Polymerizable compound (KAYARAD DPHA, manufactured by Nippon Kayaku Co., Ltd.) . . . 1.2 parts by mass
Photoradical polymerization initiator (IRGACURE-OXE01, manufactured by BASF SE) . . . 0.6 parts by mass
Surfactant 101 . . . 4.2 parts by mass
Ultraviolet absorber (UV-503, manufactured by Daito Chemical Co., Ltd.) . . . 0.5 parts by mass
PGMEA . . . 19.5 parts by mass (Red Composition 1)

The following components were mixed and stirred, and the obtained mixture was filtered through a nylon filter (manufactured by Nihon Pall Corporation) having a pore size of 0.45 μm to prepare a Red composition 1.

Red pigment dispersion liquid . . . 51.7 parts by mass
40% PGMEA solution of the resin 101 . . . 0.6 parts by mass
Polymerizable compound 101 . . . 0.6 parts by mass
Photoradical polymerization initiator (IRGACURE-OXE01, manufactured by BASF SE) . . . 0.3 parts by mass
Surfactant 101 . . . 4.2 parts by mass
PGMEA . . . 42.6 parts by mass (Blue Composition 1)

The following components were mixed and stirred, and the obtained mixture was filtered through a nylon filter (manufactured by Nihon Pall Corporation) having a pore size of 0.45 μm to prepare a Blue composition 1.

Blue pigment dispersion liquid . . . 44.9 parts by mass
40% PGMEA solution of the resin 101 . . . 2.1 parts by mass
Polymerizable compound (KAYARAD DPHA, manufactured by Nippon Kayaku Co., Ltd.) . . . 1.5 parts by mass
Polymerizable compound 101 . . . 0.7 parts by mass
Photoradical polymerization initiator (IRGACURE-OXE01, manufactured by BASF SE) . . . 0.8 parts by mass
Surfactant 101 . . . 4.2 parts by mass
PGMEA . . . 45.8 parts by mass Raw materials used in the Green composition 1, the Red composition 1, and the Blue composition 1 are as follows.

Green Pigment Dispersion Liquid

A mixed solution consisting of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads; diameter: 0.3 mm) for 3 hours. As a result, a pigment dispersion liquid was prepared. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm$^3$ at a flow rate of 500 g/min. This dispersing treatment was repeated 10 times. As a result, a Green pigment dispersion liquid was obtained.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm$^3$ at a flow rate of 500 g/min. This dispersing treatment was repeated 10 times. As a result, a Red pigment dispersion liquid was obtained.

Blue Pigment Dispersion Liquid

A mixed solution consisting of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), 82.4 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersing treatment was repeated 10 times. As a result, a Blue pigment dispersion liquid was obtained.

Polymerizable compound 101: compound having the following structure

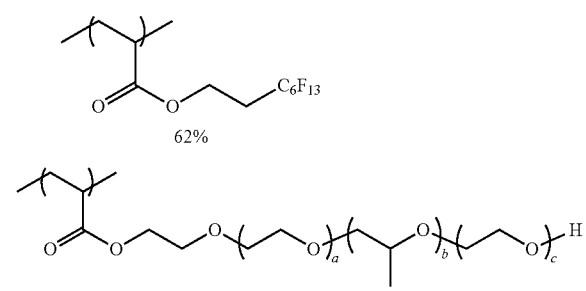

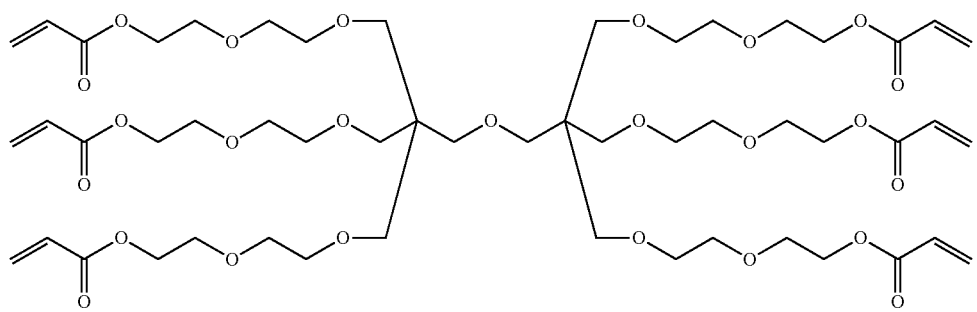 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Resin 101: resin having the following structure (acid value=70 mgKOH/g, Mw=11000; a numerical value added to a main chain represents a mass ratio of the repeating unit)

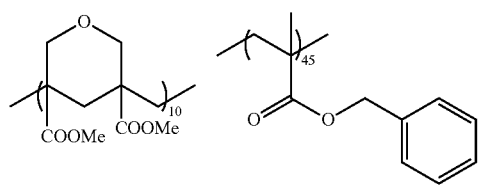

-continued

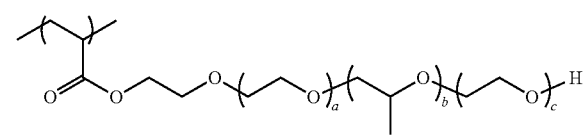

a + c = 14
b = 17

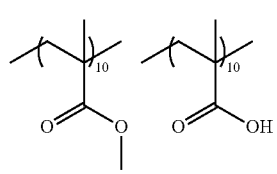

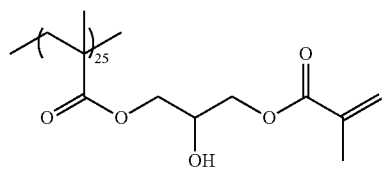

Surfactant 101: 1 mass % PGMEA solution of the following mixture (Mw=14000; in the following formula, "%" representing the proportion of a repeating unit is mol %)

Example 201

(Preparation of Composition for Forming Near Infrared Transmitting Filter)

The following raw materials and triethylamine as the amine compound according to the present invention were mixed and stirred, and the obtained mixture was filtered through a nylon filter (manufactured by Nihon Pall Corporation) having a pore size of 0.45 μm to prepare a composition (composition for forming a near infrared transmitting filter) of Example 201. The composition of Example 201 contained 200 mass ppm of triethylamine in the total solid content. Using this composition, the number of foreign matter defects was counted in the same manner as in Example 1. All evaluations of the defect types 1 and 2 were A.

A near infrared transmitting filter was formed by the following method using the obtained composition. That is, CT-4000L (manufactured by Fujifilm Electronic Materials Co., Ltd.) was uniformly applied onto an 8-inch (20.32 cm) silicon wafer by spin coating to form a coating film. The formed coating film was heated using an oven at 220° C. for 1 hour to cure the coating film. As a result, an undercoat layer was formed. The rotation speed during the spin coating was adjusted such that the thickness of the heated coating film was about 0.1 μm. Next, this composition obtained as described above was applied onto the undercoat layer of the silicon wafer using a spin coater such that the thickness of the film after drying was 2.0 μm, and was dried using a hot plate at 100° C. for 120 seconds. Next, using an i-ray stepper exposure device FPA-i5+ (manufactured by Canon Corporation), the coating film was irradiated with light having a wavelength of 365 nm at an exposure dose of 1000 mJ/cm² through a mask having a 100 μm×100 μm island pattern. After the exposure, the exposed film was developed using an alkali developer (CD-2000, manufactured by Fujifilm Electronic Materials Co., Ltd.) at 25° C. for 40 seconds. Thereafter, the developed film was rinsed with flowing water for 30 seconds and spray-dried to obtain a pattern, thereby forming a near infrared transmitting filter.

Pigment dispersion liquid A1-1 . . . 49.01 parts by mass
Pigment dispersion liquid A1-2 . . . 26.11 parts by mass
Polymerizable compound 201 . . . 2.87 parts by mass
Photoradical polymerization initiator 201 . . . 0.261 parts by mass
Photoradical polymerization initiator 202 . . . 0.910 parts by mass
Resin 201 . . . 1.0 part by mass
Surfactant 201 . . . 0.05 parts by mass
Polymerization inhibitor (paramethoxyphenol) . . . 0.0014 parts by mass
Additive (EPICLON N-695, manufactured by DIC Corporation) . . . 0.64 parts by mass
PGMEA . . . 19.20 parts by mass (Pigment Dispersion Liquid A1-1)

A mixed solution having the following composition was mixed and dispersed using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion liquid was prepared.

C. I. Pigment Red 254 . . . 6.92 parts by mass
C. I. Pigment Yellow 139 . . . 4.02 parts by mass
C. I. Pigment Blue 15:6 . . . 7.06 parts by mass
Resin 202 . . . 8.1 parts by mass
PGMEA . . . 73.9 parts by mass (Pigment Dispersion Liquid A1-2)

A mixed solution having the following composition was mixed and dispersed using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion liquid was prepared.

Near infrared absorbing pigment A1 . . . 6.70 parts by mass
Compound P4 . . . 0.80 parts by mass
Resin 202 . . . 6.0 parts by mass
PGMEA . . . 86.5 parts by mass Polymerizable compound 201: compound having the following structure

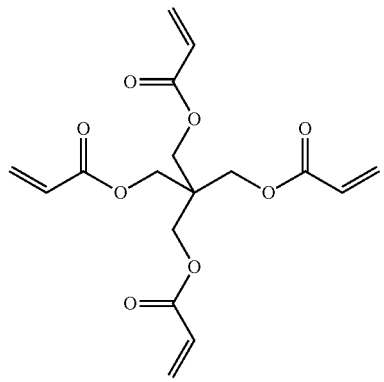 [SMILES: C=CC(=O)OCC(COC(=O)C=C)(COC(=O)C=C)COC(=O)C=C]

Photoradical polymerization initiator 201: IRGACURE-OXE01, manufactured by BASF SE Photoradical polymerization initiator 202: compound having the following structure

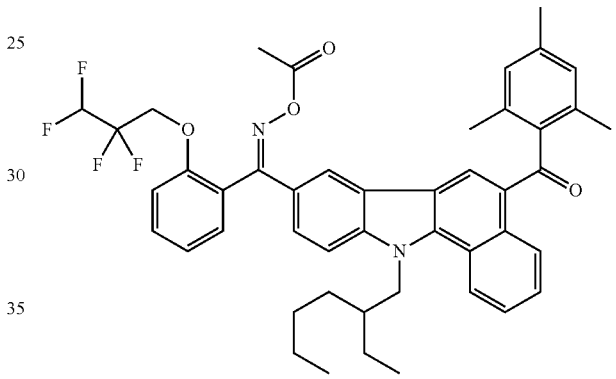

Resin 201: resin having the following structure (Mw=40,000; a numerical value added to a main chain represents a mass ratio of the repeating unit)

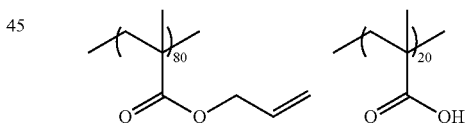

Resin 202: resin having the following structure (a numerical value added to a main chain represents a molar ratio, and a numerical value added to a side chain represents the number of repeating units; Mw=20,000).

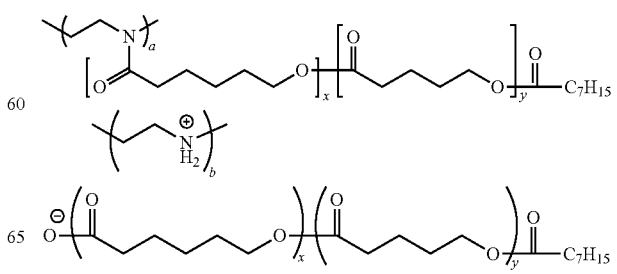

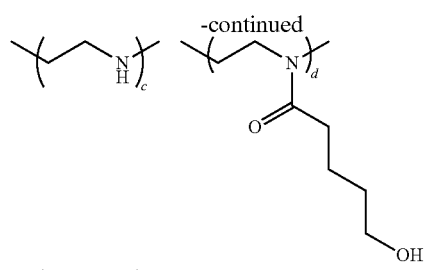

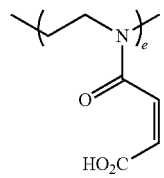

a/b/c/d/e = 36/4/35/1/24 (mol%)
x = 48 y = 12

Surfactant 201: following mixture (Mw=14000; in the formula, "%" representing the proportion of a repeating unit is mol %)

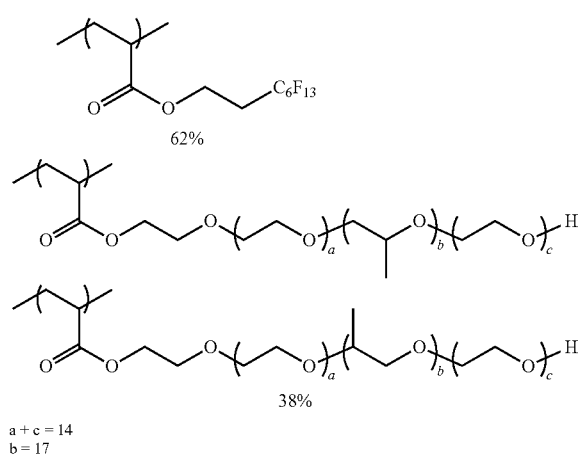

a + c = 14
b = 17

EXPLANATION OF REFERENCES

110: solid-state imaging element
111: near infrared cut filter
112: color filter
114: near infrared transmitting filter
115: microlens
116: planarizing layer

What is claimed is:

1. A composition comprising:
a near infrared absorbing pigment;
a compound represented by Formula (1);
a primary to tertiary amine compound having a molecular weight of 500 or less, boiling point of 120° C. or lower, and one amino group in the molecule;
a resin; and
a solvent,
wherein the compound represented by Formula (1) has a solubility in propylene glycol methyl ether acetate at 25° C. of 0.1 g/L or higher, and
a content of the primary to tertiary amine compound in a total solid content of the composition is 10 to 5000 mass ppm, $$P^1\text{-}(L^1\text{-}(X^1)_n)_m \tag{1}$$

in Formula (1), $P^1$ represents a colorant structure, $L^1$ represents a single bond or a linking group, $X^1$ represents an acid group, a basic group, a group having a salt structure, or a phthalimide methyl group, m represents an integer of 1 or more, n represents an integer of 1 or more, in a case where m represents 2 or more, a plurality of $L^1$'s and a plurality of $X^1$'s may be different from each other, and in a case where n represents 2 or more, a plurality of $X^1$'s may be different from each other.

2. The composition according to claim 1, wherein the primary to tertiary amine compound is an aliphatic amine compound.

3. The composition according to claim 1, wherein the primary to tertiary amine compound is an alkylamine.

4. The composition according to claim 1, wherein the near infrared absorbing pigment is at least one selected from the group consisting of a pyrrolopyrrole compound, a polymethine compound, a diimmonium compound, a dithiolene compound, a phthalocyanine compound, a porphyrin compound, an azo compound, a triarylmethane compound, and a perylene compound.

5. The composition according to claim 1, wherein a solubility of the near infrared absorbing pigment in propylene glycol methyl ether acetate at 25° C. is lower than the solubility of the compound represented by Formula (1) in propylene glycol methyl ether acetate at 25° C.

6. The composition according to claim 1, wherein $P^1$ in Formula (1) is a colorant structure derived from a near infrared absorbing colorant.

7. The composition according to claim 1, wherein $P^1$ in Formula (1) is a colorant structure selected from the group consisting of a pyrrolopyrrole colorant structure, a polymethine colorant structure, a diimmonium colorant structure, a dithiolene colorant structure, a phthalocyanine colorant structure, a porphyrin colorant structure, an azo colorant structure, a triarylmethane colorant structure, a perylene colorant structure, and a quinacridone colorant structure.

8. The composition according to claim 1, wherein $P^1$ in Formula (1) is a colorant structure having a skeleton common to the near infrared absorbing pigment.

9. The composition according to claim 1, wherein $X^1$ in Formula (1) is an acid group, and the resin is a resin including a basic group.

10. The composition according to claim 1, wherein $X^1$ in Formula (1) is at least one acid group selected from the group consisting of a carboxyl group, a sulfo group, a carboxylic acid amide group, a sulfonic acid amide group, and an imide acid group.

11. A film formed of the composition according to claim 1.

12. An optical filter comprising:
the film according to claim 11.

13. The optical filter according to claim 12, wherein the optical filter is a near infrared cut filter or a near infrared transmitting filter.

14. An optical filter comprising:
a pixel having the film according to claim 11, and
at least one pixel selected from the group consisting of a red pixel, a green pixel, a blue pixel, a magenta pixel, a yellow pixel, a cyan pixel, a black pixel, and an achromatic pixel.

15. A laminate comprising:
the film according to claim 11; and
a color filter including a chromatic coloring agent.

16. A solid-state imaging element comprising:
the film according to claim 11.

17. An image display device comprising:
the film according to claim 11.

18. An infrared sensor comprising:
the film according to claim 11.

* * * * *